(12) United States Patent
Bower et al.

(10) Patent No.: US 9,923,133 B2
(45) Date of Patent: *Mar. 20, 2018

(54) STRUCTURES AND METHODS FOR TESTING PRINTABLE INTEGRATED CIRCUITS

(71) Applicant: X-Celeprint Limited, Cork (IE)

(72) Inventors: Christopher Bower, Raleigh, NC (US); Etienne Menard, Limoges (FR); Matthew Meitl, Durham, NC (US)

(73) Assignee: X-Celeprint Limited, Cork (IE)

( * ) Notice: Subject to any disclaimer, the term of this patent is extended or adjusted under 35 U.S.C. 154(b) by 0 days.

This patent is subject to a terminal disclaimer.

(21) Appl. No.: 14/831,236

(22) Filed: Aug. 20, 2015

(65) Prior Publication Data
US 2015/0380619 A1   Dec. 31, 2015

Related U.S. Application Data

(63) Continuation of application No. 13/818,901, filed as application No. PCT/US2011/048945 on Aug. 24, 2011, now Pat. No. 9,142,468.
(Continued)

(51) Int. Cl.
*H01L 23/58* (2006.01)
*H01L 33/62* (2010.01)
(Continued)

(52) U.S. Cl.
CPC .............. *H01L 33/62* (2013.01); *G01R 31/26* (2013.01); *G01R 31/2644* (2013.01);
(Continued)

(58) Field of Classification Search
USPC ................. 257/418, 415, 417, 253, 254, 48
See application file for complete search history.

(56) References Cited

U.S. PATENT DOCUMENTS 5,475,224 A    12/1995  Koh
5,621,555 A     4/1997  Park
(Continued)

FOREIGN PATENT DOCUMENTS

JP      2011066130 A   3/2011
WO  WO-2008/103931 A2  8/2008
(Continued)

OTHER PUBLICATIONS

International Search Report and Written Opinion for PCT/US2011/048945 dated Nov. 23, 2011.
(Continued)

*Primary Examiner* — Timor Karimy
(74) *Attorney, Agent, or Firm* — William R. Haulbrook; Alexander D. Augst; Choate, Hall & Stewart LLP

(57) ABSTRACT

A substrate includes an anchor area physically secured to a surface of the substrate and at least one printable electronic component. The at least one printable electronic component includes an active layer having one or more active elements thereon, and is suspended over the surface of the substrate by electrically conductive breakable tethers. The electrically conductive breakable tethers include an insulating layer and a conductive layer thereon that physically secure and electrically connect the at least one printable electronic component to the anchor area, and are configured to be preferentially fractured responsive to pressure applied thereto. Related methods of fabrication and testing are also discussed.

21 Claims, 29 Drawing Sheets

Related U.S. Application Data

(60) Provisional application No. 61/377,131, filed on Aug. 26, 2010.

(51) Int. Cl.
| | | |
|---|---|---|
| *H01L 21/683* | (2006.01) | |
| *H01L 21/66* | (2006.01) | |
| *G01R 31/26* | (2014.01) | |
| *H01L 21/308* | (2006.01) | |
| *H01L 25/075* | (2006.01) | |
| *H01L 33/16* | (2010.01) | |
| *H01L 33/30* | (2010.01) | |
| *H01L 33/34* | (2010.01) | |
| *H01L 33/48* | (2010.01) | |

(52) U.S. Cl.
CPC ........ *H01L 21/308* (2013.01); *H01L 21/6835* (2013.01); *H01L 22/14* (2013.01); *H01L 22/30* (2013.01); *H01L 22/32* (2013.01); *H01L 25/0753* (2013.01); *H01L 33/16* (2013.01); *H01L 33/30* (2013.01); *H01L 33/34* (2013.01); *H01L 33/48* (2013.01); *H01L 2221/6835* (2013.01); *H01L 2221/68381* (2013.01); *H01L 2924/0002* (2013.01)

(56) References Cited

U.S. PATENT DOCUMENTS

| | | |
|---|---|---|
| 5,815,303 A | 9/1998 | Berlin |
| 5,882,532 A | 3/1999 | Field et al. |
| 6,142,358 A | 11/2000 | Cohn et al. |
| 6,278,242 B1 | 8/2001 | Cok et al. |
| 6,577,367 B2 | 6/2003 | Kim |
| 6,717,560 B2 | 4/2004 | Cok et al. |
| 6,756,576 B1 | 6/2004 | McElroy et al. |
| 6,933,532 B2 | 8/2005 | Arnold et al. |
| 7,129,457 B2 | 10/2006 | McElroy et al. |
| 7,195,733 B2 | 3/2007 | Rogers et al. |
| 7,288,753 B2 | 10/2007 | Cok |
| 7,354,801 B2 | 4/2008 | Sugiyama et al. |
| 7,521,292 B2 | 4/2009 | Rogers et al. |
| 7,557,367 B2 | 7/2009 | Rogers et al. |
| 7,586,497 B2 | 9/2009 | Boroson et al. |
| 7,622,367 B1 | 11/2009 | Nuzzo et al. |
| 7,662,545 B2 | 2/2010 | Nuzzo et al. |
| 7,704,684 B2 | 4/2010 | Rogers et al. |
| 7,799,699 B2 | 9/2010 | Nuzzo et al. |
| 7,816,856 B2 | 10/2010 | Cok et al. |
| 7,893,612 B2 | 2/2011 | Cok |
| 7,927,976 B2 | 4/2011 | Menard |
| 7,932,123 B2 | 4/2011 | Rogers et al. |
| 7,943,491 B2 | 5/2011 | Nuzzo et al. |
| 7,972,875 B2 | 7/2011 | Rogers et al. |
| 7,982,296 B2 | 7/2011 | Nuzzo et al. |
| 7,999,454 B2 | 8/2011 | Winters et al. |
| 8,029,139 B2 | 10/2011 | Ellinger et al. |
| 8,039,847 B2 | 10/2011 | Nuzzo et al. |
| 8,198,621 B2 | 6/2012 | Rogers et al. |
| 8,207,547 B2 | 6/2012 | Lin |
| 8,261,660 B2 | 9/2012 | Menard |
| 8,334,545 B2 | 12/2012 | Levermore et al. |
| 8,394,706 B2 | 3/2013 | Nuzzo et al. |
| 8,440,546 B2 | 5/2013 | Nuzzo et al. |
| 8,470,701 B2 | 6/2013 | Rogers et al. |
| 8,502,192 B2 | 8/2013 | Kwak et al. |
| 8,506,867 B2 | 8/2013 | Menard |
| 8,664,699 B2 | 3/2014 | Nuzzo et al. |
| 8,686,447 B2 | 4/2014 | Tomoda et al. |
| 8,722,458 B2 | 5/2014 | Rogers et al. |
| 8,754,396 B2 | 6/2014 | Rogers et al. |
| 8,766,970 B2 | 7/2014 | Chien et al. |
| 8,791,474 B1 | 7/2014 | Bibl et al. |
| 8,794,501 B2 | 8/2014 | Bibl et al. |
| 8,803,857 B2 | 8/2014 | Cok |
| 8,817,369 B2 | 8/2014 | Daiku |
| 8,835,940 B2 | 9/2014 | Hu et al. |
| 8,854,294 B2 | 10/2014 | Sakariya |
| 8,877,648 B2 | 11/2014 | Bower et al. |
| 8,889,485 B2 | 11/2014 | Bower |
| 8,895,406 B2 | 11/2014 | Rogers et al. |
| 8,987,765 B2 | 3/2015 | Bibl et al. |
| 9,434,150 B2 | 9/2016 | Bower et al. |
| 9,520,537 B2 | 12/2016 | Bower et al. |
| 9,601,356 B2 | 3/2017 | Bower et al. |
| 2003/0141570 A1 | 7/2003 | Chen et al. |
| 2006/0063309 A1 | 3/2006 | Sugiyama et al. |
| 2006/0079010 A1 | 4/2006 | Hara et al. |
| 2007/0032089 A1 | 2/2007 | Nuzzo et al. |
| 2007/0173034 A1 | 7/2007 | Tsurume et al. |
| 2007/0281556 A1 | 12/2007 | Elliott et al. |
| 2008/0079246 A1* | 4/2008 | Dix ............. B60R 21/232 280/730.2 |
| 2008/0108171 A1* | 5/2008 | Rogers ........... B81C 1/0046 438/73 |
| 2009/0202089 A1* | 8/2009 | Zhang ............. H04R 1/222 381/174 |
| 2010/0248484 A1 | 9/2010 | Bower et al. |
| 2010/0306993 A1* | 12/2010 | Mayyas ......... B81C 1/00873 29/592.1 |
| 2010/0317132 A1 | 12/2010 | Rogers et al. |
| 2012/0228669 A1 | 9/2012 | Bower et al. |
| 2012/0314388 A1 | 12/2012 | Bower et al. |
| 2013/0069275 A1 | 3/2013 | Menard et al. |
| 2013/0088416 A1 | 4/2013 | Smith et al. |
| 2013/0196474 A1 | 8/2013 | Meitl et al. |
| 2013/0207964 A1 | 8/2013 | Fleck et al. |
| 2013/0221355 A1 | 8/2013 | Bower et al. |
| 2013/0273695 A1 | 10/2013 | Menard et al. |
| 2014/0104243 A1 | 4/2014 | Sakariya et al. |
| 2014/0264763 A1 | 9/2014 | Meitl et al. |
| 2014/0267683 A1 | 9/2014 | Bibl et al. |
| 2014/0340900 A1 | 11/2014 | Bathurst et al. |
| 2014/0367633 A1 | 12/2014 | Bibl et al. |
| 2015/0028362 A1 | 1/2015 | Chan et al. |
| 2015/0135525 A1 | 5/2015 | Bower |
| 2015/0137153 A1 | 5/2015 | Bibl et al. |
| 2015/0371874 A1 | 12/2015 | Bower et al. |
| 2015/0372053 A1 | 12/2015 | Bower et al. |
| 2016/0020131 A1 | 1/2016 | Bower et al. |
| 2016/0086855 A1 | 3/2016 | Bower et al. |
| 2016/0093600 A1 | 3/2016 | Bower et al. |
| 2017/0047306 A1 | 2/2017 | Meitl et al. |
| 2017/0154819 A1 | 6/2017 | Bower et al. |
| 2017/0173852 A1 | 6/2017 | Moore et al. |

FOREIGN PATENT DOCUMENTS

| | | | |
|---|---|---|---|
| WO | WO-2011/123285 A1 | 10/2011 | |
| WO | WO-2015/193435 A1 | 12/2015 | |

OTHER PUBLICATIONS

International Preliminary Report on Patentability for PCT/US2011/048945 dated Mar. 7, 2013.
Cok, R. S. et al., AMOLED displays with transfer-printed integrated circuits, Journal of the SID, 19(4):335-341 (2011).
Roscher, H., VCSEL Arrays with Redundant Pixel Designs for 10Gbits/s 2-D Space-Parallel MMF Transmission, Annual Report, optoelectronics Department, (2005).
Yaniv et al., A 640×480 Pixel Computer Display Using Pin Diodes with Device Redundancy, 1988 International Display Research Conference, IEEE, CH-2678-1/88:152-154 (1988).

\* cited by examiner

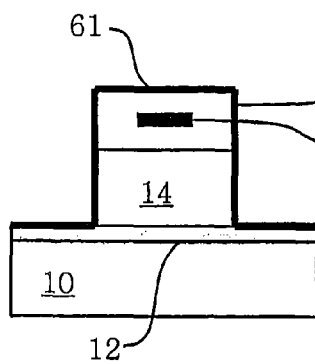
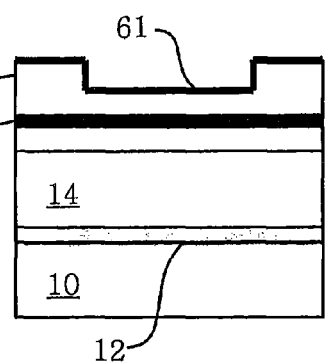
Fig. 14A  Fig. 14B
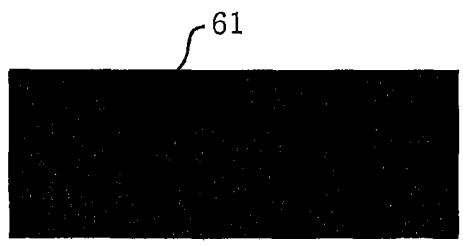
Fig. 14C
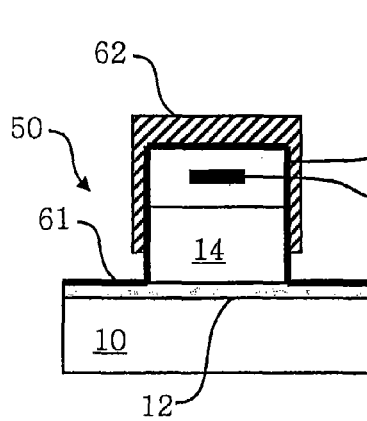
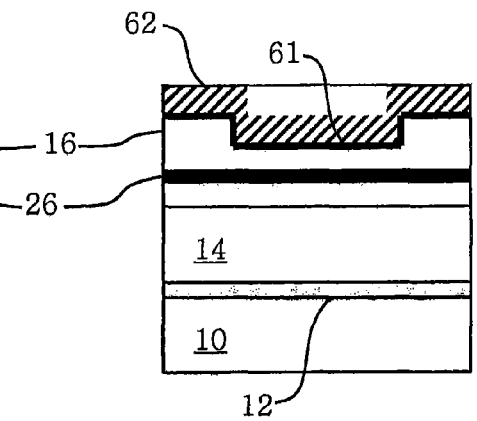
Fig. 15A  Fig. 15B
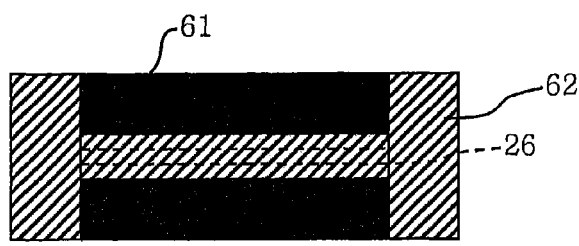
Fig. 15C

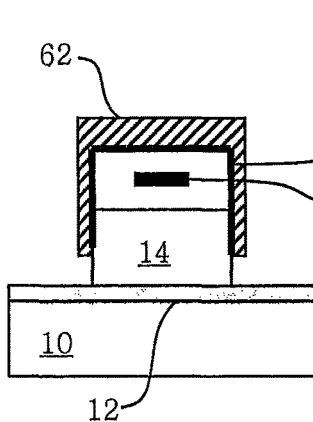 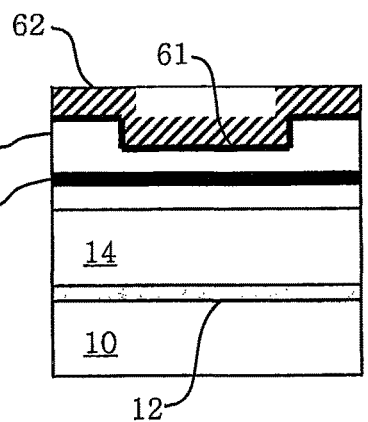
Fig. 16A　　　　　　　　Fig. 16B
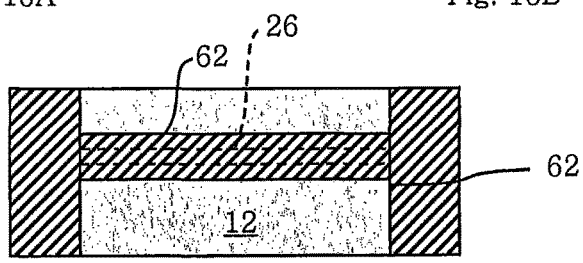
Fig. 16C
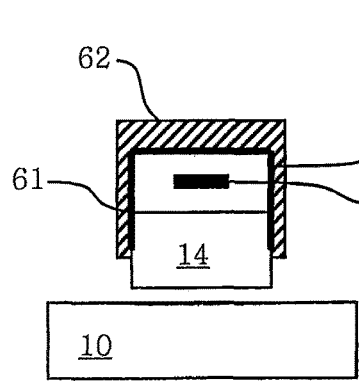 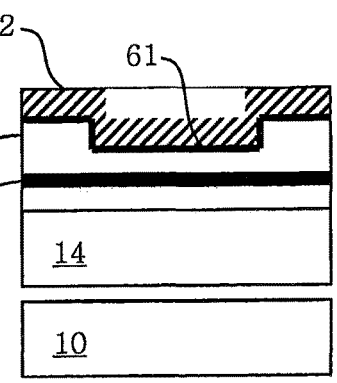
Fig. 17A　　　　　　　　Fig. 17B
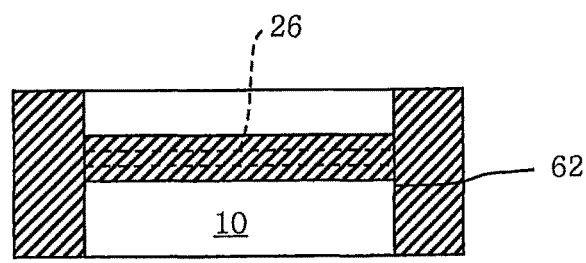
Fig. 17C

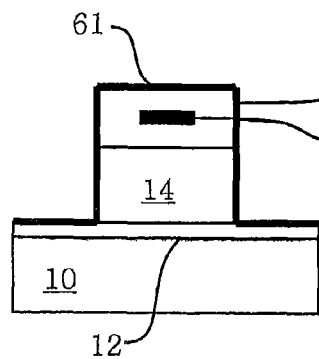 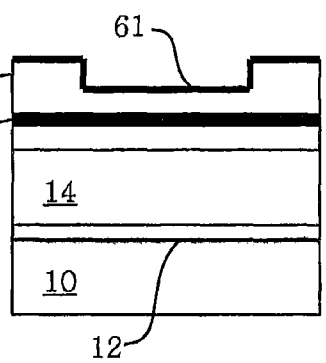
Fig. 24A  Fig. 24B
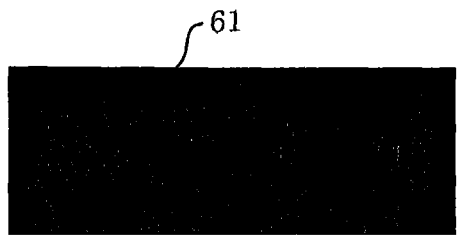
Fig. 24C
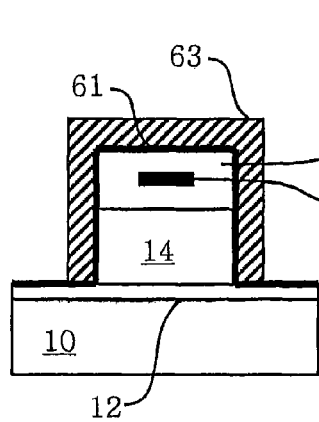 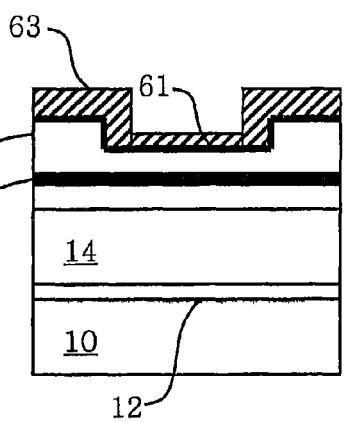
Fig. 25A  Fig. 25B
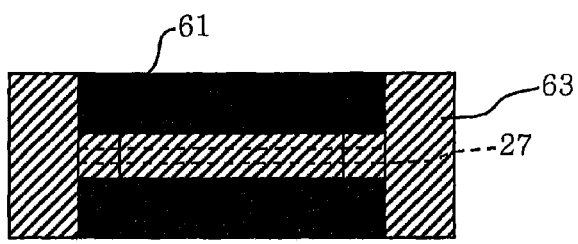
Fig. 25C

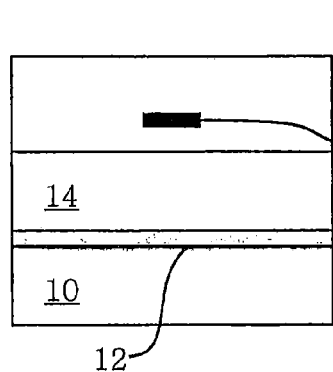
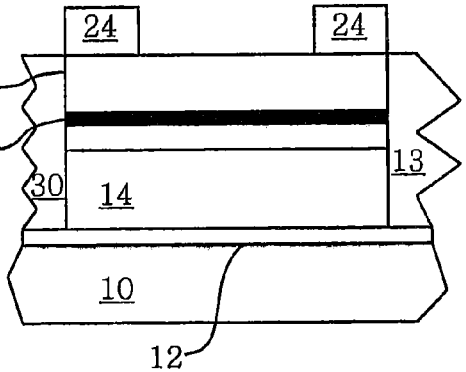
Fig. 40A     Fig. 40B
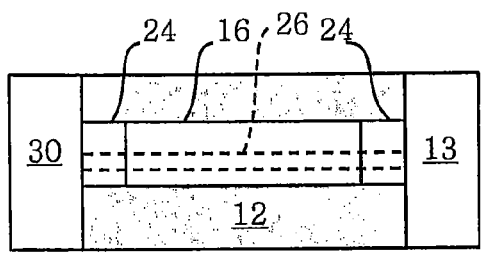
Fig. 40C
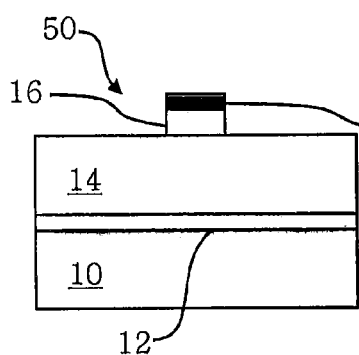
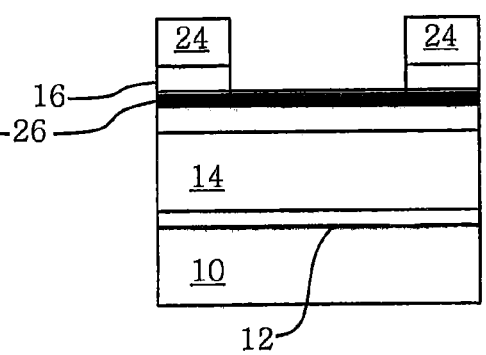
Fig. 41A     Fig. 41B
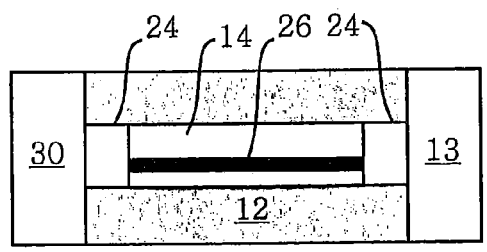
Fig. 41C

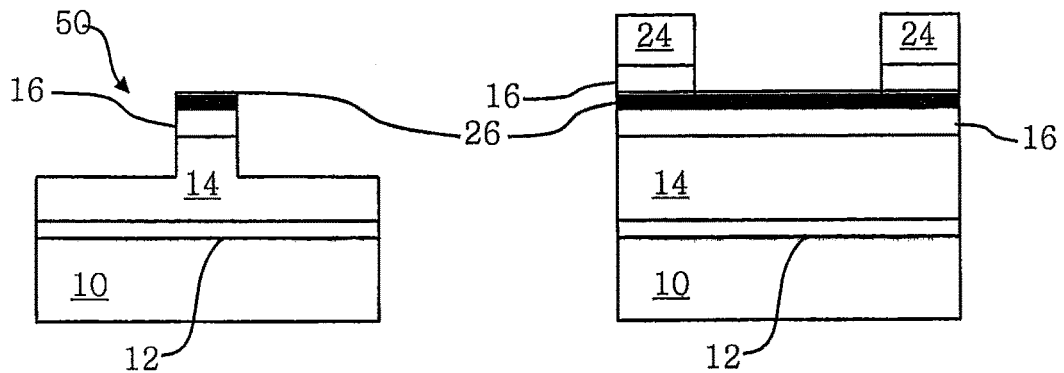
Fig. 42A
Fig. 42B
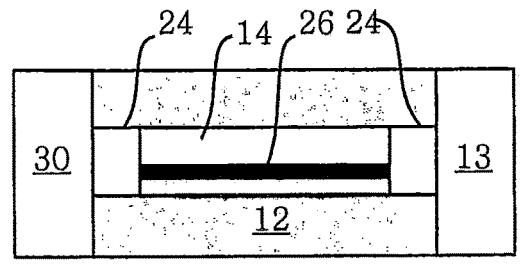
Fig. 42C
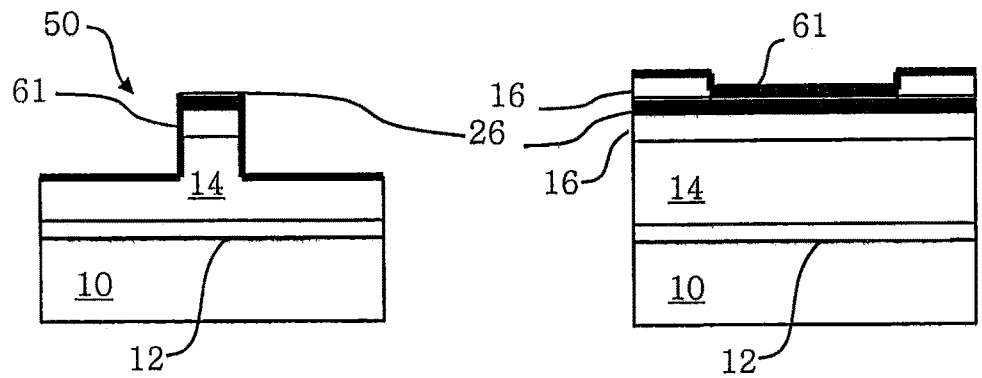
Fig. 43A
Fig. 43B
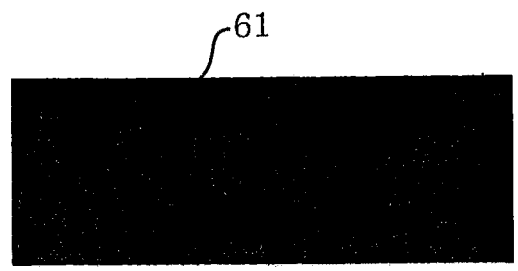
Fig. 43C

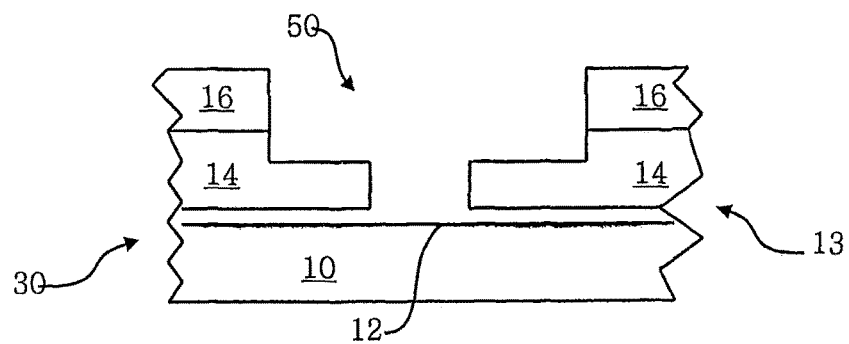
Fig. 44D
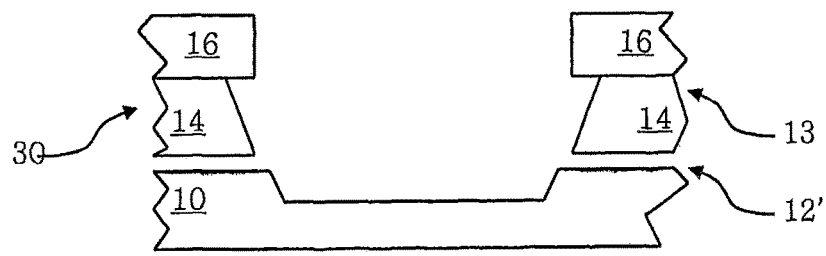
Fig. 44E
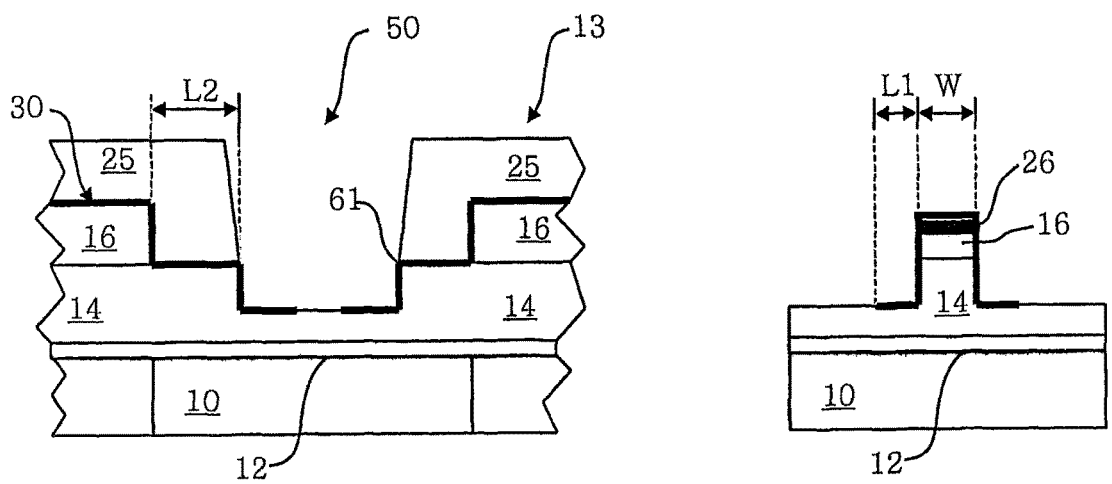
Fig. 45A
Fig. 45B

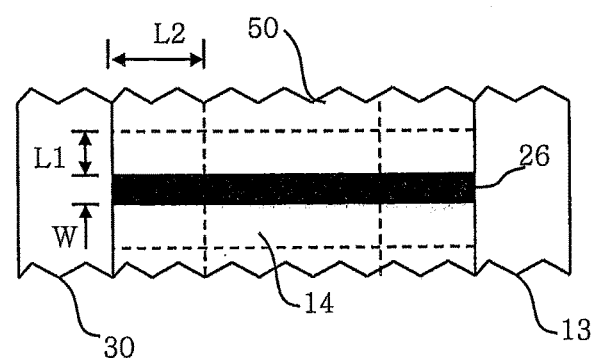
Fig. 45C
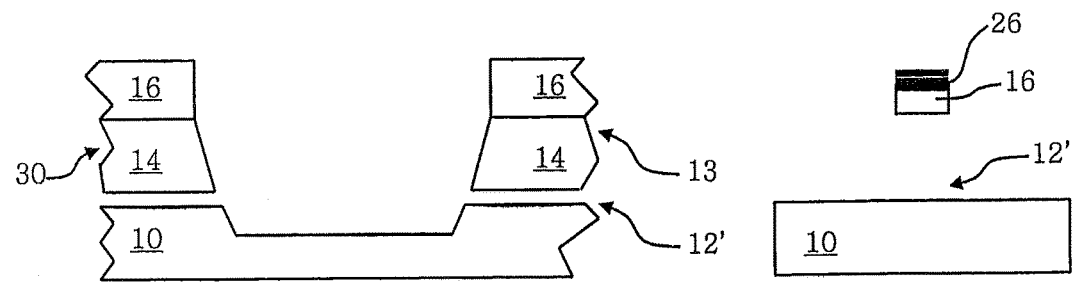
Fig. 45D
Fig. 45E

STRUCTURES AND METHODS FOR TESTING PRINTABLE INTEGRATED CIRCUITS

CLAIM OF PRIORITY

The present application is a continuation of U.S. patent application Ser. No. 13/818,901 filed Feb. 25, 2013, entitled "Structures And Methods For Testing Printable Integrated Circuits", which is a 35 U.S.C. §371 national phase application of PCT International Application No. PCT/US2011/048945, entitled "Structures And Methods For Testing Printable Integrated Circuits", having an international filing date of Aug. 24, 2011, which claims priority from U.S. Provisional Patent Application No. 61/377,131 entitled "Structures And Methods For Testing Printable Integrated Circuits," filed with the United States Patent and Trademark Office on Aug. 26, 2010, the disclosure disclosures of which are incorporated by reference herein in its entirety their entireties. The above PCT International Application was published in the English language as International Publication No. WO 2012/027458 A1.

FIELD

The present invention is directed to apparatus and methods for testing substrates with small, active circuit elements.

BACKGROUND

Integrated circuits and other electronically active devices are constructed on wafers, usually crystalline semiconductor wafers, using photolithographic processes used in the microelectronics industry. Each wafer usually includes multiple, identical devices that are separated from the wafer after construction, for example, by sawing. The devices can then be packaged, tested for functionality, and sold.

To avoid expenses associated with sawing and packaging defective devices, devices can be tested while they are still a part of the original wafer in which the devices were constructed. A variety of methods can be used to accomplish this. For example, pads accessible to test probes can be provided on each device, electrical signals can be applied to the pads, and the device can thereby be tested. The device response can then be compared to a device that is known to function properly, and a functionality determination can be made.

Sometimes circuitry can be included on the wafer substrate that is not included in the packaged devices. The circuitry can provide access from an external tester and can also aid in applying test signals to the test devices and in collecting and interpreting the response of devices. Such wafer-scale testing is described, for example, in U.S. Pat. Nos. 4,956,602 and 5,440,241. A method for testing integrated circuits that employs serial shift registers that apply signals to various portions of a circuit and collect output is described in U.S. Pat. No. 4,293,919. The serial shift register can shift test data into the device as well as shift performance data out of the device. An external test device can load the test data into the shift register and analyze the performance data that is shifted out.

One technique used to create relatively small active components, such as integrated circuits, in a larger substrate or wafer is described in "AMOLED Displays using Transfer-Printed Integrated Circuits" published in the Proceedings of the 2009 Society for Information Display International Symposium Jun. 2-5, 2009, in San Antonio Tex., US, vol. 40, Book 2, ISSN 0009-0966X, paper 63.2 p. 947. As described in this paper, small integrated circuits are formed in a wafer and released from the wafer by etching around and beneath the circuits to form separated active components. Because the active components are so small, it may be difficult or impossible to include the relatively large pads for external test probes in the active components. Furthermore, because the circuits are separated from the substrate, it may be difficult to connect additional test circuitry to the active components, and the active components themselves can be too small to incorporate such test circuitry. Moreover, the unpackaged active components can be transferred to a destination substrate by a stamp that transfers many devices at a time, making it difficult to test the devices until they are a part of the destination substrate, at which point replacing a defective active component can be difficult.

SUMMARY

According to some aspects of the present invention, a substrate comprises: a substrate layer and an active layer; and two or more electrically active components formed in or on the active layer, wherein the two or more electrically active components are distributed over the substrate, are separated from each other by electrically functional anchors connected to the substrate layer, and are suspended over the substrate layer by electrically conductive breakable tethers that physically and electrically connect each electrically active component to an electrically functional anchor.

According to other aspects of the present invention, a method of testing electrical circuits formed on a wafer comprises: providing a substrate having a substrate layer and an active layer; providing two or more electrically active components formed in or on the active layer, wherein the two or more electrically active components are distributed over the substrate, are separated from each other by electrically functional anchors connected to the substrate layer, and are suspended over the substrate layer by electrically conductive breakable tethers that physically and electrically connect each electrically active component to an electrically functional anchor; and providing electrical energy to the electrically active components through the electrically conductive breakable tethers from the electrically functional anchors.

According to further aspects of the present invention, a method of making conductive breakable tethers comprises: providing a substrate having a sacrificial layer formed on the substrate and an active layer formed on the sacrificial layer; forming an insulating layer on the active layer, the insulating layer including one or more patterned conductive layers; processing the active substrate to form one or more electrically active components and one or more electrically functional anchors; forming a trench around each of the electrically active components, the trench extending through the active layer and insulating layer to the sacrificial layer, separating the active components from the electrically functional anchors except for the insulating layer and the patterned conductive layers; and removing the sacrificial layer to form electrically conductive breakable tethers with the insulating layer and the patterned conductive layers and suspend the electrically active components over the substrate by the electrically conductive breakable tethers.

According to some embodiments of the present invention, an integrated circuit structure includes a substrate, an anchor area physically secured to a surface of the substrate, and at least one printable electronic component comprising an active layer including one or more active elements thereon.

The at least one printable electronic component is suspended over the surface of the substrate by electrically conductive breakable tethers that physically secure and electrically connect the at least one printable electronic component to the anchor area. The electrically conductive breakable tethers include an insulating layer and a conductive layer thereon, and are configured to be preferentially fractured responsive to pressure applied thereto.

In some embodiments, the anchor area includes one or more electrical elements, and the electrically conductive breakable tethers electrically connect the one or more active elements of the at least one electronic component to the one or more electrical elements of the anchor area.

In some embodiments, one or more contact pads are provided on the substrate adjacent to and electrically coupled to the one or more electrical elements of the anchor area, The one or more contact pads may be sized and configured to be accessible to an external device. The one or more electrical elements of the anchor area may include a light emitting structure that is operable to illuminate responsive to a test signal supplied by the external device.

In some embodiments, the one or more contact pads are dimensionally larger than the one or more active elements, and are arranged along a periphery of the substrate.

In some embodiments, the active elements of the at least one electronic component comprise transistors, light emitting structures, light absorbing structures, metal wires, and/or electrical contact pads.

In some embodiments, the electrical elements of the anchor area comprise transistors, light emitting structures, metal wires, and/or electrical contact pads.

In some embodiments, the electrical elements of the anchor area comprise only passive electrical elements.

In some embodiments, the anchor area is physically secured to the surface of the substrate by a sacrificial layer, and the at least one electronic component is substantially free of the sacrificial layer and is completely detached from the surface of the substrate.

In some embodiments, the anchor area comprises a portion of the active layer, and the substrate comprises a source substrate on which the at least one electronic component and the anchor area are formed.

In some embodiments, the anchor area is a first anchor area, and the structure further includes a second anchor area having one or more electrical elements thereon. The second anchor area may be physically secured to the surface of the substrate adjacent to the first anchor area. The electrical elements of the first anchor area may be electrically connected to the electrical elements of the second anchor area.

In some embodiments, the electrically conductive breakable tethers respectively comprise one or more conductive layers and at least one insulating layer that releasably secure the electronic component to the anchor area.

In some embodiments, the electrically conductive breakable tethers further comprise respective stress-concentrating features configured to be preferentially fractured responsive to pressure applied thereto. The stress-concentrating features may include grooves or portions of the respective tethers having a reduced thickness relative to other portions thereof. Also, the stress concentrating features of the electrically conductive breakable tethers may be configured to be preferentially fractured responsive to pressure applied by a stamp to transfer the at least one printable electronic component to a target substrate.

In some embodiments, the electrically conductive breakable tethers respectively include a plurality of conductive layers with the insulating layer therebetween. The conductive layers may be stacked, and/or may be arranged in a side-by-side manner.

In some embodiments, the at least one printable electronic component includes a first printable electronic component physically secured and electrically connected to the anchor area by ones of the electrically conductive breakable tethers along a first side of the anchor area, and a second printable electronic component physically secured and electrically connected to the anchor area by ones of the electrically conductive breakable tethers along a second side of the anchor area opposite the first side.

In some embodiments, the active layer comprises a semiconductor layer. The semiconductor layer may be amorphous, polycrystalline, microcrystalline, or monocrystalline. For example, the semiconductor layer may include silicon, gallium arsenide (GaAs), and/or a III-V compound semiconductor.

In some embodiments, the electrically conductive breakable tethers include metal, polycrystalline semiconductor materials, or monocrystalline semiconductor materials.

According to further embodiments of the present invention, a method of testing elements of a printable electronic component includes providing a substrate having an anchor area physically secured to a surface of the substrate and at least one printable electronic component including one or more active elements thereon. The at least one printable electronic component is suspended over the surface of the substrate by electrically conductive breakable tethers that physically secure and electrically connect the at least one printable electronic component to the anchor area, and are configured to be preferentially fractured responsive to pressure applied thereto. The method further includes providing an electrical signal to the one or more active elements of the printable electronic component through the electrically conductive breakable tethers via the anchor area. The electrical signal may be configured to test a functionality of the one or more active elements of the printable electronic component.

In some embodiments, the anchor area also includes one or more electrical elements. The functionality of the one or more active elements of the printable electronic component may be confirmed based on an electrical or optical response of the active elements of the printable electronic component to the electrical signal, or based on an electrical or optical response of the electrical elements of the anchor area to the electrical signal.

In some embodiments, the substrate further includes one or more contact pads adjacent to and electrically coupled to the anchor area. The one or more contact pads may be and sized and configured to be accessible to an external device, and the electrical signal may be provided to the one or more contact pads from the external device to test the functionality of the one or more active elements.

In some embodiments, after providing the electrical signal to test the functionality of the one or more active elements, the method may further include pressing a stamp against the at least one printable electronic component with a pressure sufficient to fracture the electrically conductive breakable tethers and separate the at least one printable electronic component from the anchor area.

In some embodiments, the substrate may be provided by forming a sacrificial layer on the substrate and an active layer on the sacrificial layer; processing the active layer to form the at least one printable electronic component including the one or more active elements, the anchor area, and the electrically conductive breakable tethers that physically secure and electrically connect the at least one printable electronic component to the anchor area; forming a trench extending through the active layer to the sacrificial layer to substantially separate the at least one printable electronic component from the anchor area except for the electrically conductive breakable tethers therebetween; and selectively removing the sacrificial layer to suspend the at least one printable electronic component over the substrate by the electrically conductive breakable tethers.

According to still further embodiments of the present invention, a method of fabricating conductive breakable tethers includes providing a substrate, a sacrificial layer on the substrate, and an active layer on the sacrificial layer, forming an insulating layer and a patterned conductive layer on the active layer, and processing the active layer to form an anchor area and at least one printable electronic component including one or more active elements therein. A patterned trench is formed extending through the active layer and the insulating layer to expose the sacrificial layer and to substantially separate the at least one printable electronic component from the anchor area except for portions of the insulating layer and the patterned conductive layer extending therebetween, and the sacrificial layer is selectively removed to define electrically conductive breakable tethers comprising the portions of the insulating layer and the patterned conductive layer. The electrically conductive breakable tethers physically secure and electrically connect the at least one printable electronic component to the anchor area to suspend the at least one printable electronic component over the substrate. The electrically conductive breakable tethers are also configured to be preferentially fractured responsive to pressure applied thereto.

In some embodiments, processing the active layer further forms one or more electrical elements in the anchor area. The electrically conductive breakable tethers may electrically connect the one or more active elements of the at least one electronic component to the one or more electrical elements of the anchor area.

In some embodiments, forming the patterned trench includes patterning the insulating layer using the patterned conductive layer as a mask to form the portions of the insulating layer and the patterned conductive layer that define the electrically conductive breakable tethers.

In some embodiments, the patterned conductive layer includes one or more patterned metal layers, or one or more patterned polysilicon layers.

In some embodiments, the method further includes patterning the conductive layer and the one or more active elements of the at least one printable electronic component or the one or more electrical elements of the anchor area in a common processing step.

In some embodiments, the electrically conductive breakable tethers are formed using at least one common mask used to form at least some of the one or more active elements of the at least one printable electronic component, or at least some of the one or more electrical elements of the anchor area.

In some embodiments, the sacrificial layer is selectively removed such that the anchor area is physically secured to the surface of the substrate by a remaining portion of the sacrificial layer, and such that the at least one electronic component is substantially free of the sacrificial layer and is completely detached from the surface of the substrate.

In some embodiments, forming the patterned trench includes performing a shallow etch of the active layer to define a preliminary trench that does not expose the sacrificial layer, forming a protective layer pattern on the active layer and the portions of the insulating layer and the patterned conductive layer extending between the at least one electronic component and the anchor area, where the protective layer pattern exposes at least a portion of the active layer, and then etching the exposed portion of the active layer to expose the sacrificial layer.

In some embodiments, the method further includes providing a step structure in the active layer and within the preliminary trench, prior to forming the protective layer pattern thereon, such that the active layer is thicker in portions adjacent the anchor area and the at least one printable electronic component.

In some embodiments, the method further includes forming a deep implant region in the active layer. The deep implant region may include a material having a different etching characteristic than the active layer. The deep implant region may be formed in portions of the active layer adjacent the anchor area and the at least one printable electronic component.

In some embodiments, the method may further include forming a filled trench structure in the active layer that extends through the active layer to the sacrificial layer. The filled trench structure may have a different etching characteristic than the active layer. For example, the filled trench structure may include a field oxide layer, and may be formed in a portion of the active region between the at least one electronic component and the anchor area.

Other methods and/or devices according to some embodiments will become apparent to one with skill in the art upon review of the following drawings and detailed description. It is intended that all such additional embodiments, in addition to any and all combinations of the above embodiments, be included within this description, be within the scope of the invention, and be protected by the accompanying claims.

BRIEF DESCRIPTION OF THE DRAWINGS

FIGS. 10-19 A, B, and C are complementary views that successively illustrate a process of forming conductive tethers according to some embodiments of the present invention. FIGS. 10A-19A are successive cross sections taken through the tether, while FIGS. 10B-19B are corresponding successive orthogonal cross sections taken along the length of the tether, and FIGS. 10C-19C are corresponding top views of the tether, including anchor and chiplet portions;

FIGS. 20-29 A, B, and C are complementary views that successively illustrate another process of forming conductive tethers according to some embodiments of the present invention. FIGS. 20A-29A are successive orthogonal cross sections taken through the tether, while FIGS. 20B-29B are corresponding successive cross sections taken along the length of the tether, and FIGS. 20C-29C are corresponding top views of the tether, including anchor and chiplet portions;

FIGS. 40-43 A, B, and C are complementary views that successively illustrate a process of forming conductive tethers according to some embodiments of the present invention. FIGS. 40A-43A are successive cross sections taken through the tether, while FIGS. 40B-43B are corresponding successive orthogonal cross sections taken along the length of the tether, and FIGS. 40C-43C are corresponding top views of the tether, including anchor and chiplet portions;

FIGS. 44A-44D are cross sections taken across the width of the trench employing a shallow etch at successive stages of construction useful in devices according to some embodiments of the present invention;

FIG. 44E is a cross section illustrating a possible result of an active layer etch of the structure of FIG. 44D in constructing devices according to some embodiments of the present invention;

FIGS. 45A, 45B, and 45C illustrate a further shallow etch structure in constructing some embodiments of the present invention in a cross section across the trench, an orthogonal cross section across the tether, and a top view, respectively;

FIG. 45D is a cross section illustrating a possible result of an active layer etch of the structure of FIGS. 45A, 45B, and 45C in constructing devices according to some embodiments of the present invention;

FIG. 45E is a cross section through the tether illustrating a possible result of an active layer etch of the structure of FIGS. 45A, 45B, and 45C in constructing devices according to some embodiments of the present invention;

The figures are not drawn to scale since the individual elements of the drawings have too great a size variation to permit depiction to scale.

DETAILED DESCRIPTION OF EMBODIMENTS OF THE INVENTION

Embodiments of the present invention provide methods and devices for testing small active components that have been at least partially separated from a wafer on which the active components were formed, and methods for forming conductive breakable tethers that enable such tests. Accordingly, the active components can be tested prior to printing the active components, thereby avoiding the printing of defective or otherwise inoperable components on the destination substrate.

Figure 1:
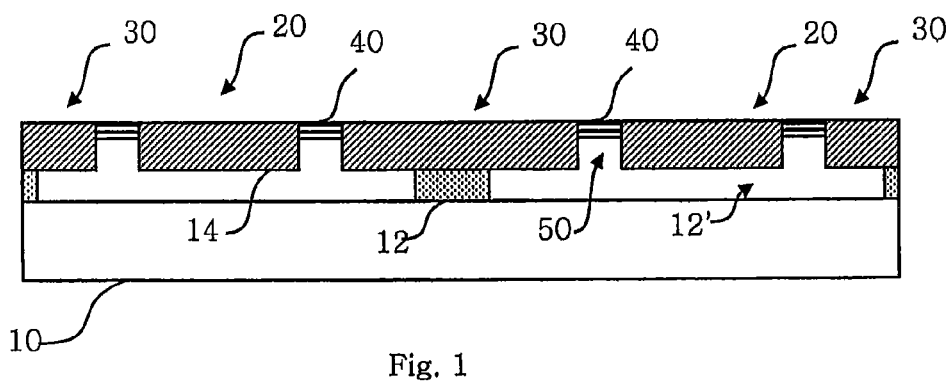
FIG. 1 is a cross section illustrating some embodiments of the present invention.

Referring to FIG. 1, a structure 10 comprises a substrate layer 10, a sacrificial layer 12, and an active layer 14. Two or more electrically active components 20 (also referred to herein as "chiplets" 13) are formed in or on the active layer 14. The two or more electrically active components 20 are distributed over the substrate 10 and are spatially separated from each other by electrically functional anchors 30 (also referred to herein as anchor areas) physically connected or secured to the substrate layer 10. The electrically active components 20 are suspended over the substrate layer 10 by electrically conductive breakable tethers 40 that physically secure and electrically connect each electrically active component 20 to one or more electrically functional anchors 30. Each electrically active component 20 can be electrically connected to two or more electrically conductive breakable tethers 40. The electrically functional anchors 30 can be physically connected to the substrate layer 10 by a sacrificial layer 12. According to some embodiments of the present invention, an electrically functional anchor includes passive electrical elements such as electrical conductors, resistors, capacitors, or contact pads. For example, in an embodiment of the present invention an electrically functional anchor can include only simple elements such as electrical conductors and electrical contact pads. In another embodiment of the present invention, an electrically functional anchor includes electrically active components such as transistors and capacitors, as well as electrical conductors or contact pads.

The substrate layer 10 can comprise, for example, a semiconductor, metal, polymer, or glass. The active layer 14 can comprise a semiconductor, for example an amorphous, polycrystalline, microcrystalline, or crystalline semiconductor. The semiconductor can be, for example, silicon, gallium arsenide (GaAs), or a III-V compound semiconductor. The sacrificial layer 12 can be an oxide, for example silicon dioxide. The breakable tethers 40 can, for example, include metal, semiconductors, or doped semiconductors, and/or can include metal layers to provide electrical conductivity as well as, for example, non-conductive dielectrics or resins. The breakable tethers 40 can be crystalline, polycrystalline, amorphous, or ductile.

Figure 2:
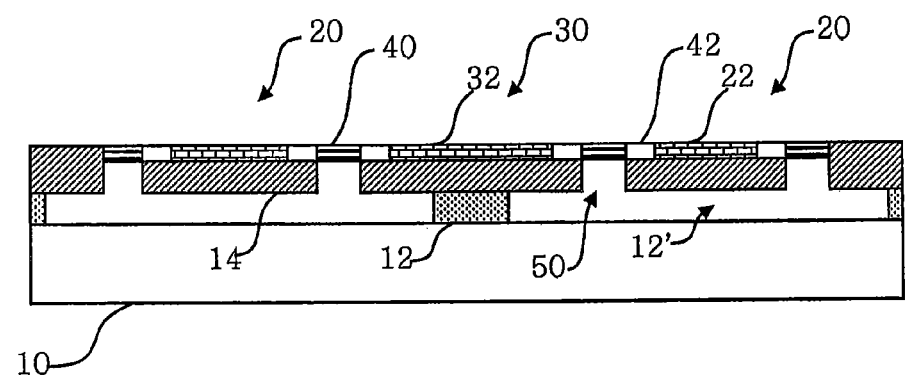
FIG. 2 is a more detailed cross section illustrating some embodiments of the present invention having doped semiconductor layers.

Referring to FIG. 2, the electrically active components 20 can further comprise electrical circuitry 22. Likewise, the electrically functional anchors 30 can further comprise electrical circuitry 32. The electrical circuitry 22, 32 can include transistors, light-emitting structures, light-absorbing structures, metal wires, and/or electrical contact pads. The electrical circuitry 22, 32 can be electrically connected to the electrically conductive breakable tethers 40 with wiring 42 (e.g. metal wires) provided or in addition to the electrical circuitry 22, 32, either in or on the active layer 14. In this way, the electrical circuits 22 in the electrically active components 20 can be electrically connected to the electrical circuitry 32 in the electrically functional anchors 30. Such circuitry and connections can be made by using photolithographic processes used in the integrated circuit art.

As shown in FIGS. 1 and 2, the electrically functional anchors 30 are connected to the substrate layer 10 by a sacrificial layer 12 beneath the electrically functional anchors 30. The sacrificial layer 12 is absent beneath the electrically active components 20, shown as the sacrificial layer location 12', so that the electrically active components 20 are suspended by the electrically conductive breakable tethers 40 over the surface of the substrate layer 10 and separated from the substrate layer (as shown by the sacrificial layer location 12'). Trenches 50 surround and isolate the electrically active components 20 from the electrically functional anchors 30 except for the electrically conductive breakable tethers 40.

Figure 3:
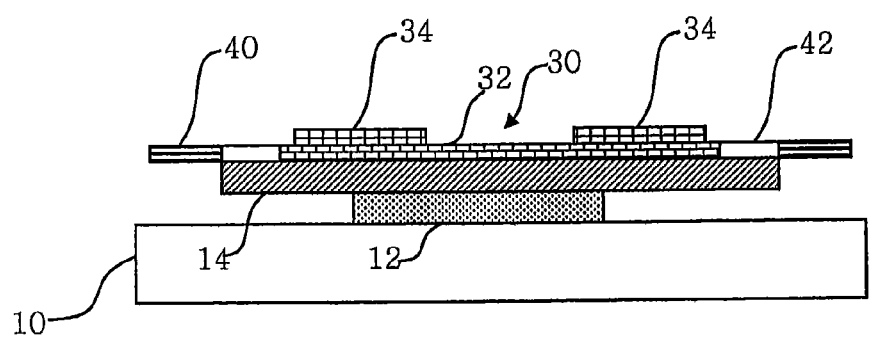
FIG. 3 is a cross section illustrating an anchor area in some embodiments of the present invention having a metal conductor.

Referring to FIG. 3, the electrically active circuitry 32 in the electrically functional anchors 30 can be electrically connected to electrical contact pads 34 that are accessible externally to the substrate. The contact pads 34 are relatively large compared to the size of the electrically active components 20, so that it can be impractical to use such electrical contact pads 34 in the small electrically active components 20.

In one embodiment of the present invention, illustrated in FIGS. 2 and 3, an electrically functional anchor 30 is connected by electrically conductive breakable tethers 40 to two different electrically active components 20.

Figure 4:
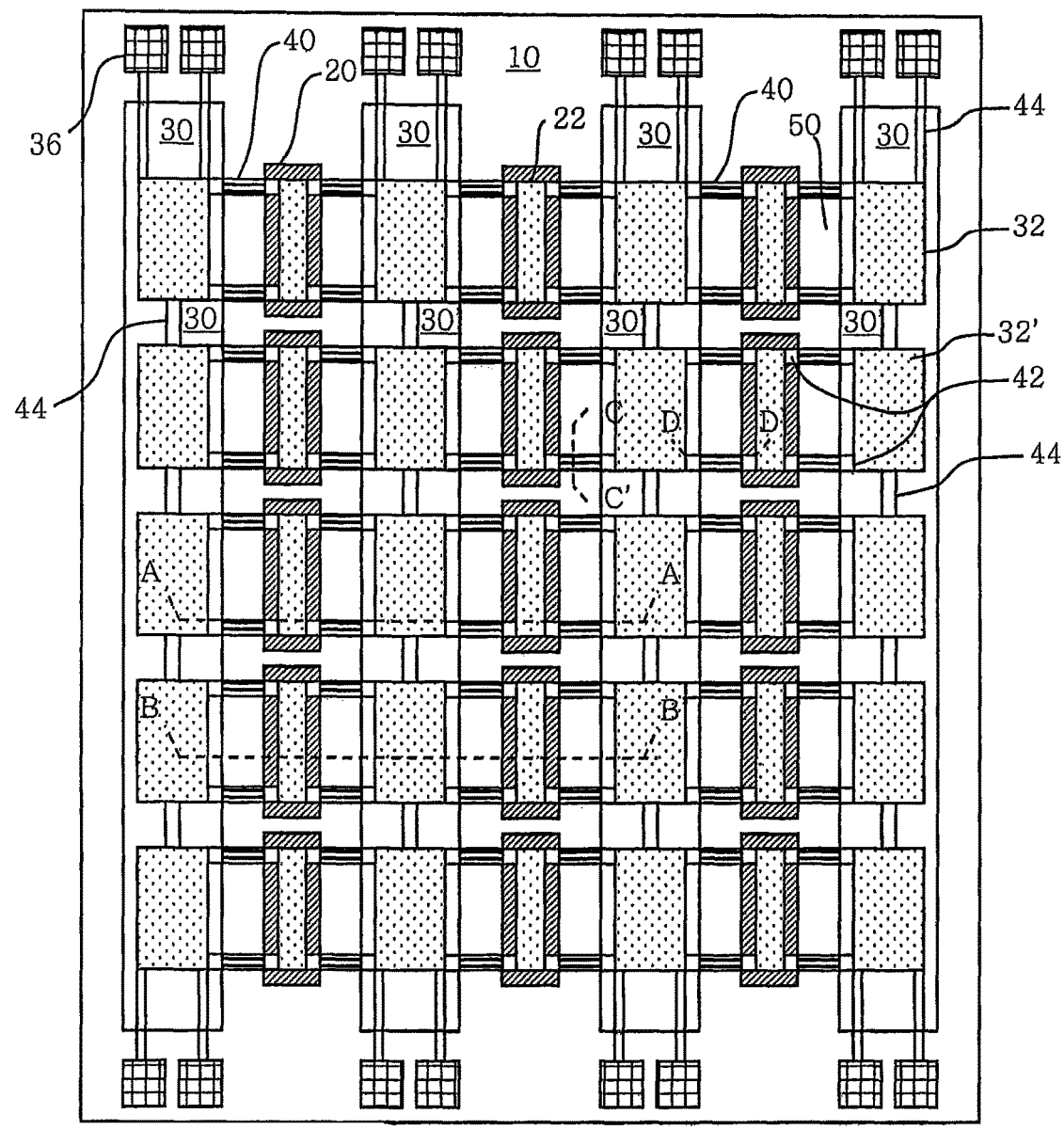
FIG. 4 is a top view illustrating some embodiments of the present invention.

As shown in the top view of FIG. 4, the electrically active circuitry 32 in a first electrically functional anchor 30 can be electrically connected to the electrically active circuitry 32' in a second different electrically functional anchor 30', for example by wiring 42. Each area adjacent to an electrically active component 20 can be considered to be a separate electrically functional anchor 30. As is also shown in FIG. 4, contact pads 36 can be provided at the edge of the substrate and can be accessed by external testers (not shown). The contact pads 36 can be electrically connected to the electrical circuitry 32 of the various anchor areas 30 to enable electrical access to the electrical circuitry 32 of the anchor areas 30, for example by wiring 44. The electrical circuitry 22 of each integrated circuit 20 can be connected to two anchors 30 through the electrically conductive tethers 40 and wires 42.

Figure 5A:
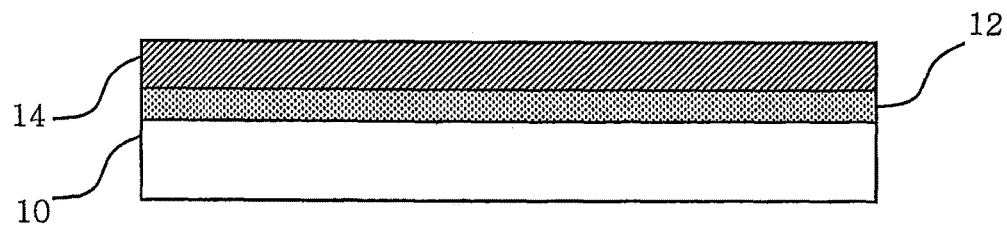
FIGS. 5A-5F are cross sections illustrating successive stages of a method of fabricating or constructing some embodiments of the present invention.

Referring to FIGS. 5A-5F, a structure of the present invention can be constructed in sequential steps illustrated by the Figures. As shown in FIG. 5A, a substrate layer 10 has a sacrificial layer 12 formed thereon, and an active layer 14 formed on the sacrificial layer 12. The layers 12, 14 can be formed, for example, by sputtering or evaporating materials onto the underlying substrate layer 10, with or without annealing the layers 12, 14. The sacrificial layer 12 can be an oxide, for example silicon dioxide, and the active layer 14 a semiconductor, for example silicon.

Figure 5B:
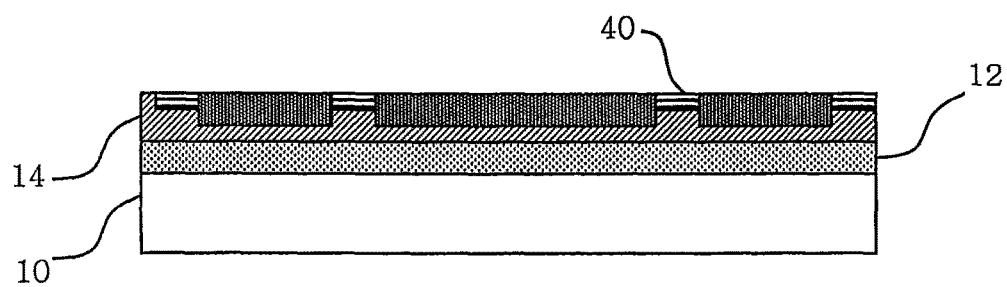
Figure 5C:
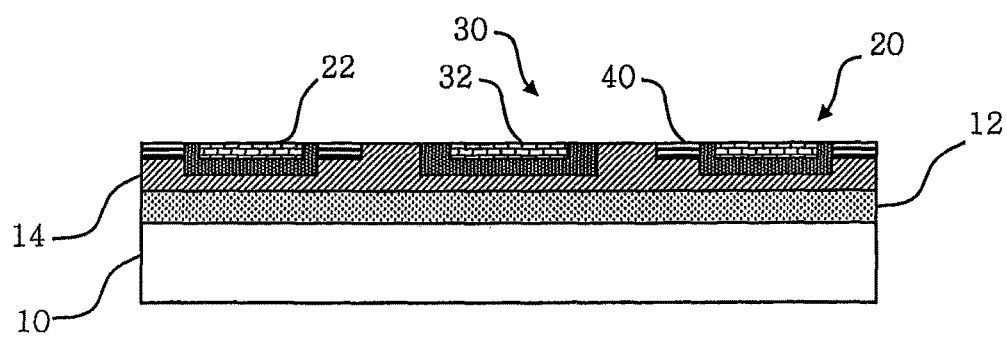
Figure 5D:
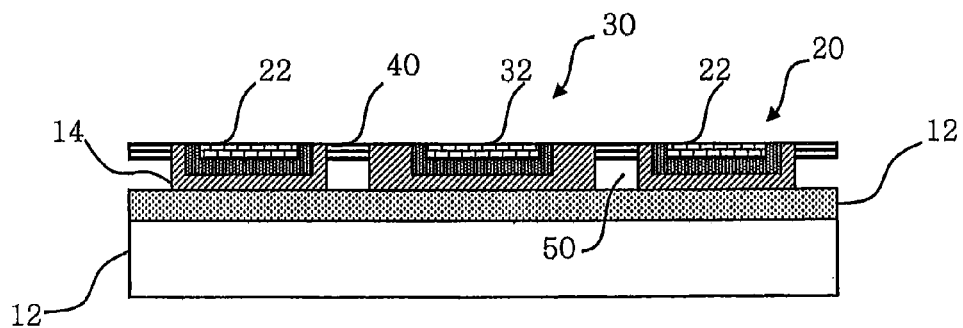

Once the layers 12, 14 are formed on the substrate layer 10, photolithographic processes used in the art can be employed to dope or otherwise process portions of the active layer 14 to form component and anchor areas. Additional deposition (e.g. by sputtering evaporation) and processing (e.g. by etching) steps can be used to form the breakable tethers 40, as shown in FIG. 5B. Electrical circuitry 22, 32 and conductors can then be formed in or on the active layer 14, including both active and passive electrical and optical elements, as shown in FIG. 5C, together with the electrically conductive breakable tethers 40. The various elements of the electrically active components, anchors and electrically conductive breakable tethers can be constructed in different ways and in different orders, depending on the design and the manufacturing processes employed, and can share common process steps. As shown in FIG. 5D, once the electrical circuitry 22, 32 and breakable tethers 40 are formed, a trench 50 can be formed that extends through the active layer 14 and surrounds the active components 20 except for the breakable tethers 40 to expose the sacrificial layer 12. Such a trench 50 can be formed using conventional processing methods, for example by coating the active layer 14 with a photo-active resin, pattern-wise curing the resin except in the trench area, removing the resin in the trench area, applying an etchant that removes the active layer material but not the cured resin, and then removing the resin. Similar processes can be used to pattern other elements of the present invention, for example the breakable tethers 40. At this stage, the active components 20 are connected to the anchors 30 with the breakable tethers 40 as shown in FIG. 5D.

Figure 5E:
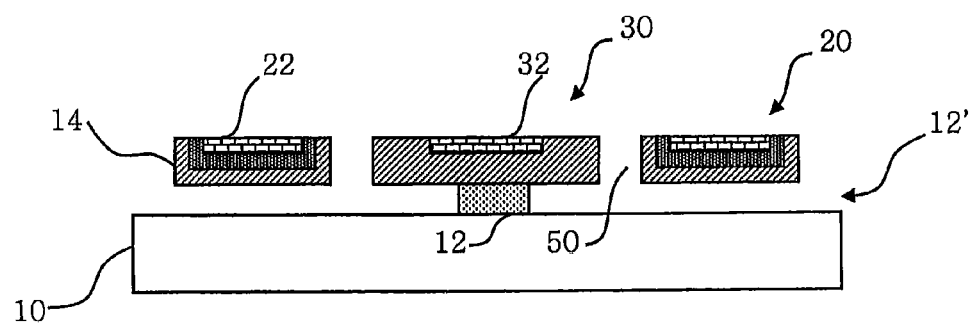
Figure 5F:
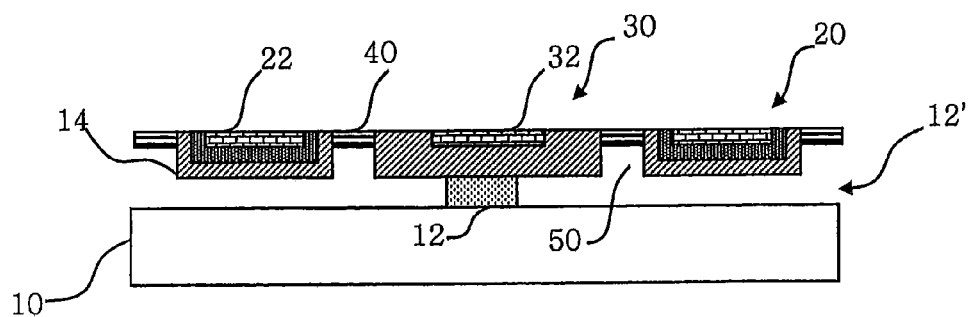
Figure 9:
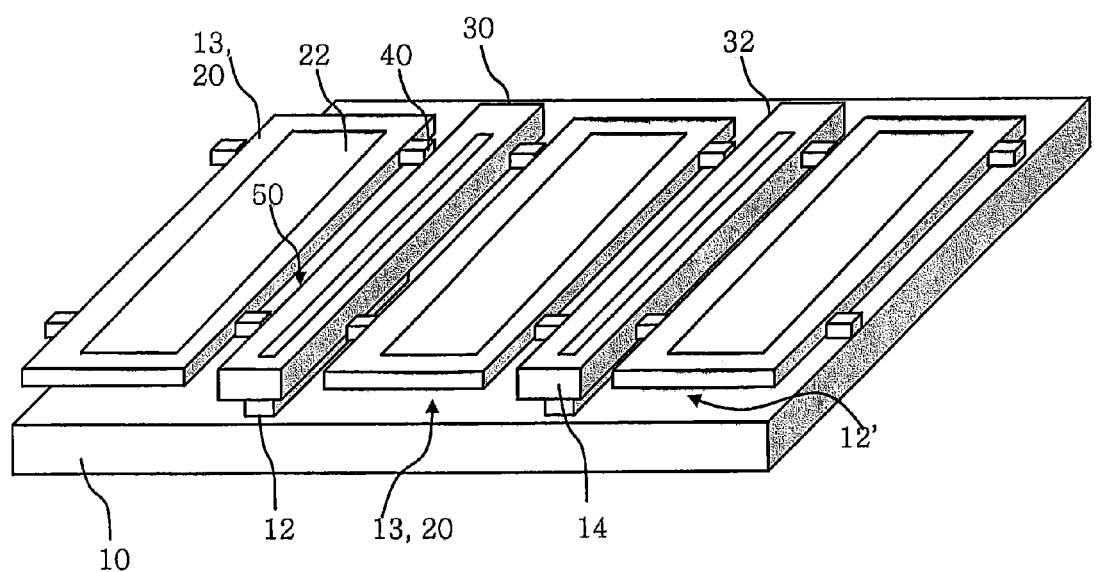
FIG. 9 is a perspective illustrating a substrate having active elements according to some embodiments of the present invention.

Once the breakable tethers 40 and the trenches 50 are formed, the sacrificial layer 12 can be removed, for example by etching, forming a sacrificial layer location 12' above which the active components 20 are suspended above the substrate layer 10 and attached by the breakable tethers 40 to the anchors 30. The etchant (for example hydrofluoric acid) should be chosen to efficiently remove the sacrificial layer without damaging the electrical circuitry 22, 32 in the active components 20 and anchors 30, or any wiring or contact pads and without releasing the anchors 30 from the substrate layer 10. Protective layers can be used to protect the various elements during etching process steps. To assist in releasing the active components 20 and not the anchors 30 from the substrate layer 10, the anchors 30 can be larger in a dimension than the active components 20, so that if the etching process is stopped at an appropriate time under appropriate conditions, the active components 20 will be released from the substrate layer 10 but not the anchors 30. FIG. 5F is a cross section A-A' taken from FIG. 4, as are FIGS. 1 and 2. FIG. 5E is a cross section B-B' taken from FIG. 4. FIG. 9 is a perspective of the structure illustrated in the cross sections of FIGS. 1, 2, 5E, and 5F. As shown in FIG. 9, a substrate layer 10 has active components 20 suspended over the substrate layer 10.

The active components 20 are connected to electrically functional anchor areas 30 by electrically conductive breakable tethers 40. Electrical circuits 22 are formed on the active components 20 and electrical circuits 32 are formed on the anchors 30. The electrically conductive breakable tethers 40 and metal wires (not shown in FIG. 9) can electrically connect the electrically active components 20 and the electrically functional anchors 30 through the electrically conductive breakable tethers 40.

Figure 6A:
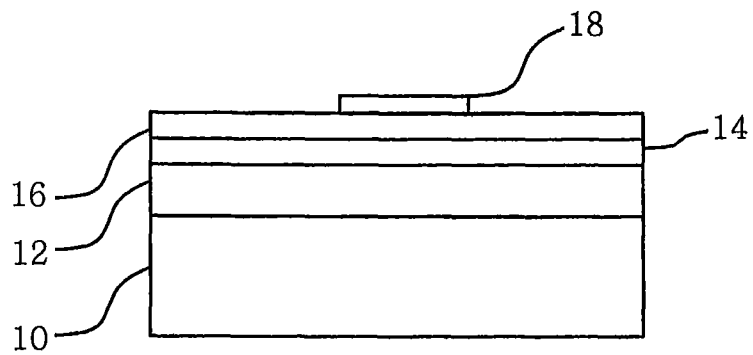
FIGS. 6A-6C are cross sections illustrating successive stages of a method of constructing electrically conductive tethers according to some embodiments of the present invention.
Figure 6B:
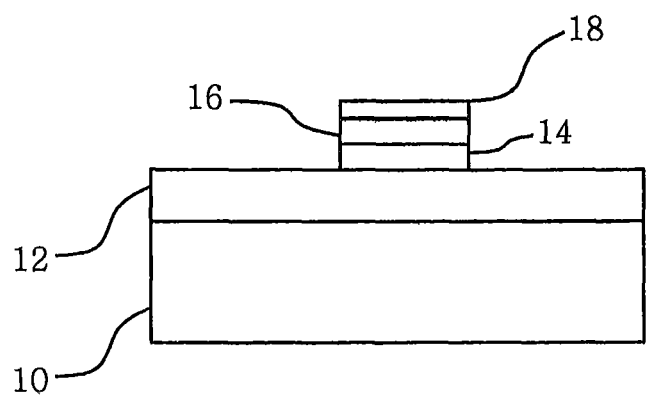
Figure 6C:
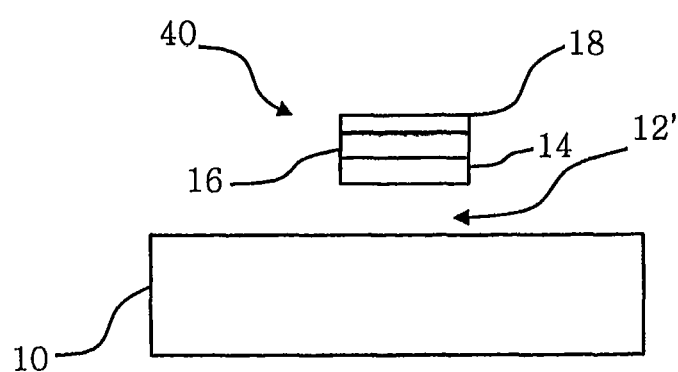

Referring to the structure of FIGS. 6A-6C, an electrically conductive tether according to some embodiments of the present invention can be constructed by providing a substrate having a substrate layer 10, a sacrificial layer 12 formed on the substrate layer 10, and an active layer 14 and a dielectric layer 16 formed on the sacrificial layer 12. An electrically conductive layer 18, for example a metal layer, is patterned over the dielectric layer 16 to form a portion of a tether. Except for the area beneath the electrically conductive layer 18, the dielectric layer 16 is etched away, as shown in FIG. 6B. The sacrificial layer 12 is then removed, as described above and shown in FIG. 6C, to leave a breakable tether 40 suspended above the substrate layer 10, fastened at either end to an active component and an anchor (not shown in this cross section). FIG. 6C is a cross section of an electrically active tether taken along the line C-C' of FIG. 4. The steps used to form the breakable tethers can be the same steps as are used to form the electrical circuitry, active components, and/or anchor. For example, the deposition of metal layer 18 can be the same step as might be employed to form electrically conductive traces in the active component, anchors, or to form contact pads.

In some embodiments of the present invention, an electrically conductive tether includes two or more electrical conductors, the two or more electrical conductors electrically connected across a trench to an electrically active component and to electrical circuitry in an electrically functional anchor. The two or more electrical conductors can be arranged side by side on the breakable tether (when viewed from above the tether) or the two or more electrical conductors can be vertically stacked one above another in the breakable tether. In the case of three or more electrical conductors, some electrical conductors can be located side by side while others can be vertically stacked in the breakable tether.

Figure 7A:
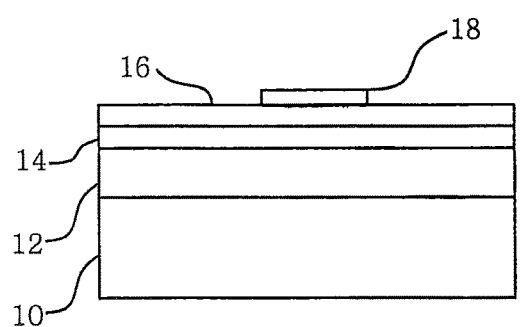
FIGS. 7A-7D are cross sections illustrating successive stages of a method of constructing electrically conductive tethers with multiple conductors according to some embodiments of the present invention.
Figure 7B:
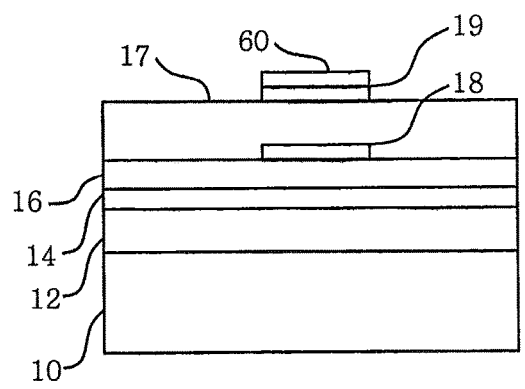
Figure 7C:
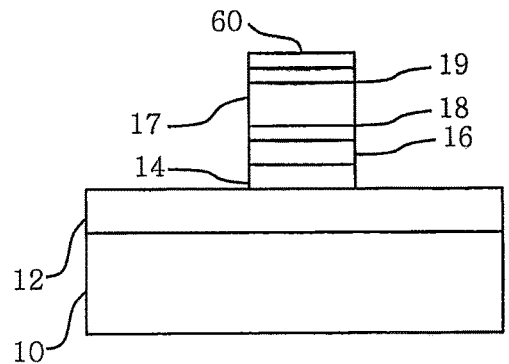
Figure 7D:
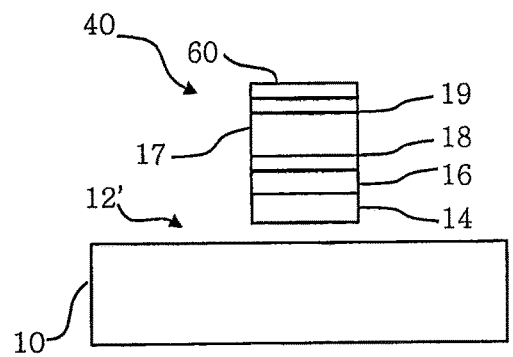

Referring to FIGS. 7A-7D, a multi-layer tether having vertically stacked multiple, separate electrical conductors can be constructed by providing a substrate having a substrate layer 10, a sacrificial layer 12 formed on the substrate layer 10, and an active layer 14 and a dielectric layer 16 formed on the sacrificial layer 12. An electrically conductive layer 18, for example a metal layer, is patterned over the dielectric layer 16 and forms a portion of a tether (FIG. 7A). Referring to FIG. 7B, second dielectric layer 17 is then coated over the first dielectric layer 16 and the patterned metal layer 18 followed by a second patterned metal layer 19. A patterned protective layer 60 (e.g. amorphous silicon) forming a capping layer can be employed to protect the metal layer 19 from subsequent processing steps (and can also be used to protect other components). The dielectric layers 16, 17 are then etched (FIG. 7C) and the sacrificial layer 12 removed (FIG. 7D) leaving a multi-conductor tether suspended above the substrate layer 10.

Referring to FIGS. 40A, 40B, and 40C, in a further embodiment of the present invention, a substrate 10 is provided, a sacrificial layer 12 formed on the substrate 10, an active layer 14 formed on the sacrificial layer 12, and an interlayer dielectric layer 16 formed on active layer 14. A photoresist layer 24 can be patterned over the ends of the structure by the anchor 30 and chiplet 13. Referring to FIGS. 41A, 41B, and 41C, the dielectric layer 16 is etched down to the active layer 14. These processes are similar to those of FIGS. 6A-6B, 7A-7C, 10A-10C and 11A-11C. In contrast to FIGS. 6C, 7D, and 12A-12C, however, referring to FIGS. 42A, 42B, and 42C, a shallow etch of the active layer 14 is performed, rather than a complete etch, so that a portion of the active layer 14 remains after the etch step to define a preliminary portion of the trench. Referring to FIGS. 43A, 43B, and 43C, the subsequent removal of the photoresist layer 24 and deposition of a protective layer 61, e.g. an amorphous silicon layer, is similar to those of FIGS. 13A-13C and 14A-14C.

Figure 44A:
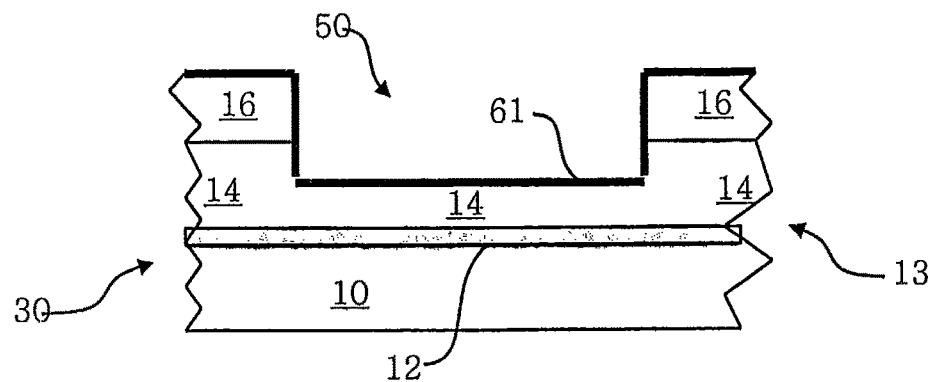
Figure 44B:
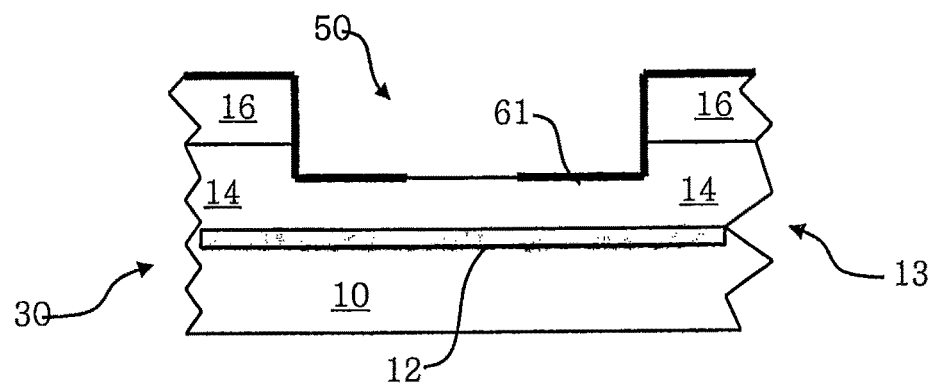
Figure 44C:
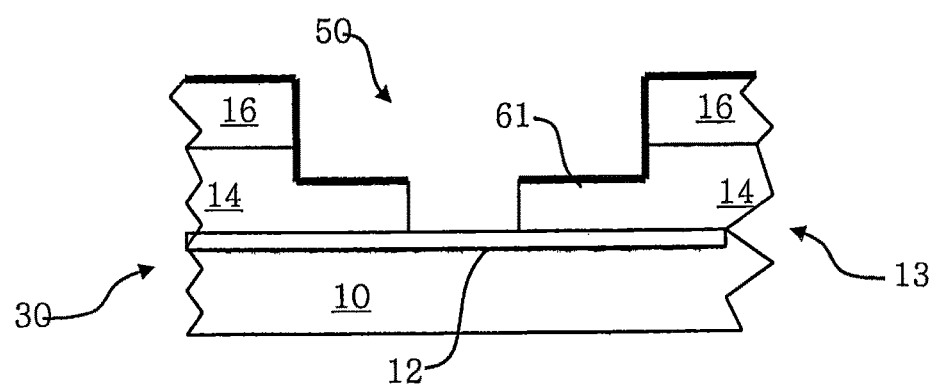

Referring to FIG. 44A, in one embodiment of the present invention, the initial shallow etch (FIGS. 42A, 42B, and 42C) extends across the trench 50 and is protected with protective layer 61. Referring to FIG. 44B, the protective layer 61 can be patterned to expose the active layer 14, which is then etched to expose the sacrificial layer 12 (FIG. 44C). The sacrificial layer 12 is then removed while the protective layer 61 is in place to protect other components, such as electrical circuitry, from the sacrificial etch. The protective layer 61 is then removed (FIG. 44D), exposing the remainder of the active layer 14. The remainder of the active layer 14 is then removed, for example with a wet or dry etch. However, as shown in FIG. 44E, this etch can undercut the active layer 14 material used in the anchor 30 and chiplet 13. Although not illustrated, an undercut can also occur with the processes illustrated in FIGS. 6A-6C and 7A-7D.

By employing the initial shallow etch to remove only a portion of the active layer 14 and creating a step structure in the active layer 14, the extent of the undercut can be controlled. For example, in a further embodiment illustrated in FIGS. 45A, 45B, and 45C, the shallow etch extends across only a portion of the trench 50 leaving a step structure at the sides of the trench 50 (FIG. 45A) and the sides of the tether (FIG. 45B). Such an etch can be performed by adjusting the photoresist mask 24 (shown e.g. in FIGS. 42A, 42B, 42C). The photoresist layer 25 is illustrated in FIG. 45A. In particular, referring to FIG. 45A in a cross section across the trench and FIG. 45B in a cross section along the tether, it is advantageous to ensure that the step distance L2 of FIG. 45A is greater than the step distance of L1+W/2 in FIG. 45B. The depth of the step can also be adjusted, as necessary, although a common step depth can be preferred to reduce mask steps. FIG. 45C illustrates a top view of the tether and trench structure. In this way, the removal of the active layer 14 material under the tether can be completed before undercut begins in the side walls of the anchor 30 and chiplet 13 areas (FIGS. 45D and 45E). In the illustration of FIG. 45D, a subsequent etch of the active layer 14 will have reduced undercut in the anchor 30 and chiplet 13 areas. This technique also enables finer features to be constructed in the tethers.

Figure 46A:
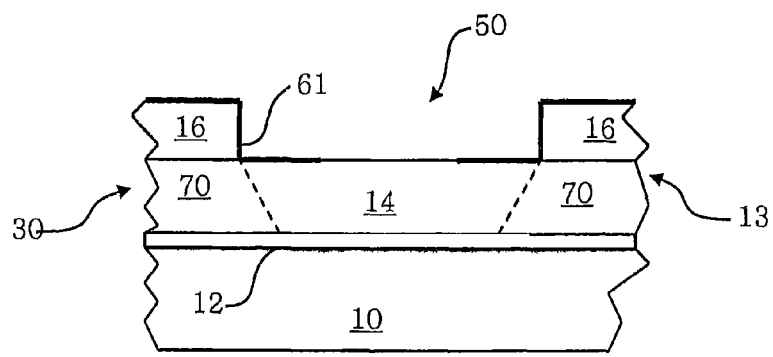
FIGS. 46A, 46B, 46C, and 46D illustrate successive series of cross sections across the trench for making a further structure having deep implants in constructing some embodiments of the present invention.
Figure 46B:
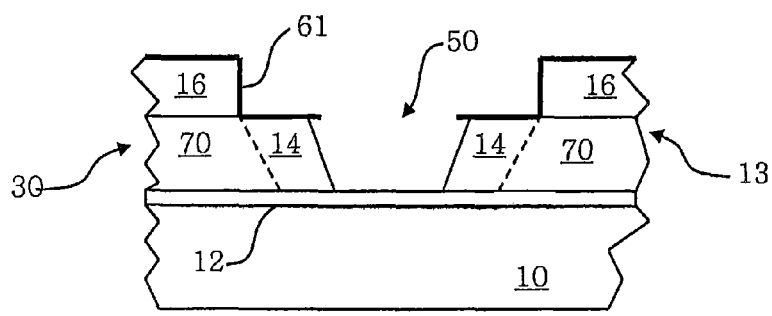
Figure 46C:
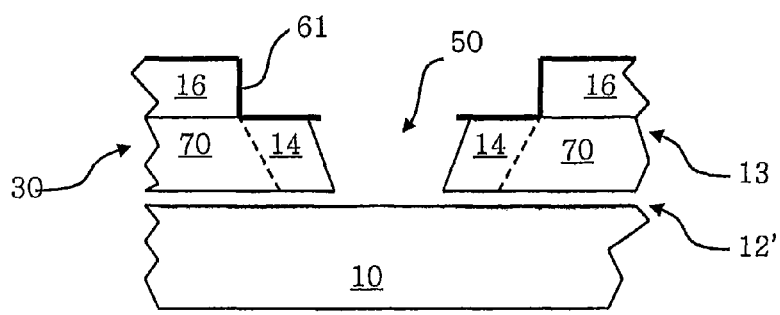
Figure 46D:
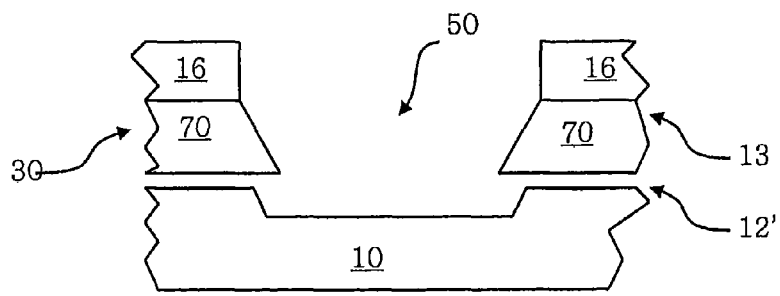

In a further method of controlling the integrated circuit and anchor undercut due to etching the active layer 14, a deep implant of a doped or alternative material is formed within the active layer 14. Referring to FIG. 46A, a substrate 10 has a sacrificial layer 12 formed thereon. An active layer 14 having deep implants 70 located at either end of a tether adjacent to the anchor 30 and chiplet 13 is formed over the sacrificial layer 12. Materials for doping and implanting in layers are well known in the semiconductor industry. The deep implant material should have different etching characteristics than the active layer material, thus providing selective etching compared to the active layer material. A dielectric layer 16 is formed over the active layer 14 and deep implants 70. The active layer 14 and dielectric layer 16 are patterned to form desired circuits and structures. A protective layer 61 is patterned over the surface of the dielectric layer, exposing a portion of the active layer 14 in the middle of the trench 50 surrounding the chiplet 13. These steps are similar to those of FIGS. 44A and 44B with the exception of the shallow-etch-structured active layer 14. As shown in FIG. 46B, the central portion of the active layer 14 in the center of the trench 50 is etched away and then the sacrificial layer 12, leaving the chiplet 13 suspended over the substrate 10 (FIG. 46C). The protective layer 61 is removed together with the remaining portion of the active layer 14 (FIG. 46D). The etchant used to remove the active layer 14 material does not etch, at least to the same extent as the material of the active layer 14, the deep implants 70, thus mitigating undercut of the chiplet 13 and anchor area 30.

Figure 47A:
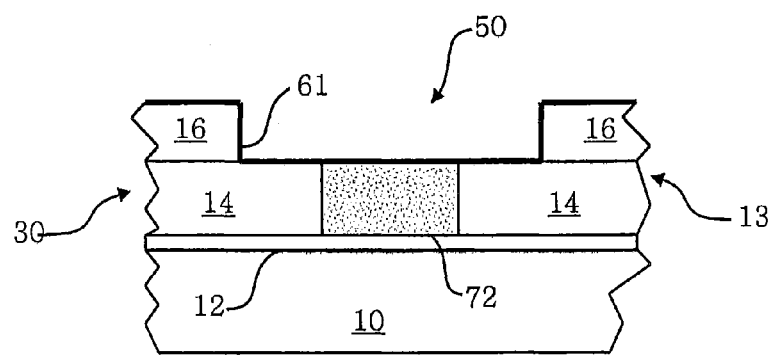
FIGS. 47A, 47B, 47C, and 47D illustrate successive series of cross sections across the trench for making a further structure having trench fills in constructing some embodiments of the present invention.
Figure 47B:
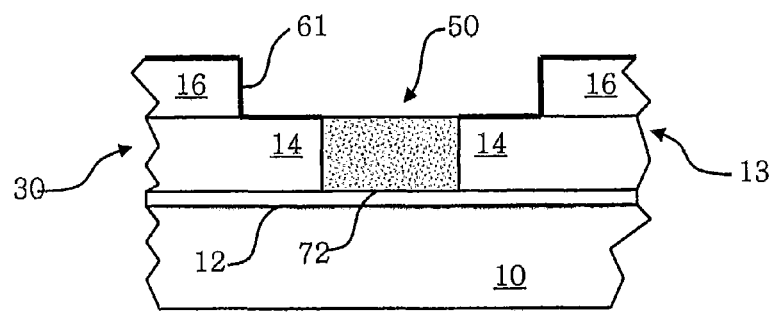
Figure 47C:
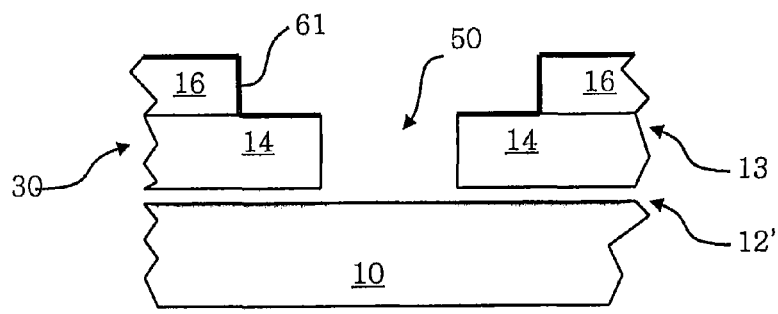
Figure 47D:
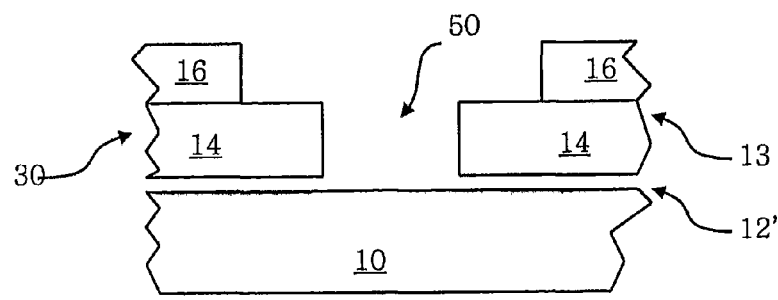

In still another method of controlling the undercut due to etching the active layer 14, a filled trench of material is formed within the active layer 14 in the trench 50 area. Referring to FIG. 47A, a substrate 10 has a sacrificial layer 12 formed thereon. An active layer 14 has a filled trench 72 located in a central portion of the trench 50. Materials useful for a filled trench, for example, a field oxide, are well known in the semiconductor industry, as well as means for patterning such a trench within a layer such as active layer 14. The filled trench material should have different etching characteristics than the active layer material, thus providing selective etching compared to the active layer material. A dielectric layer 16 is formed over the active layer 14 and filled trench 70. The active layer 14 and dielectric layer 16 are patterned to form desired circuits and structures. A protective layer 61 is patterned over the surface of the dielectric layer, exposing the filled trench 72. These steps are similar to those of FIGS. 44A and 44B with the exception of the active layer 14 with the filled trench 72. As shown in FIG. 47B, the filled trench 72 portion of the active layer 14 in the center of the trench 50 is etched away and then the sacrificial layer 12, while the remainder of the structure is protected with protective layer 61, leaving the chiplet 13 suspended over the substrate 10 (FIG. 47C). The protective layer 61 is removed (FIG. 46D). While etching the filled trench 72 might undercut to some extent the active layer 14, since the filled trench 72 does not extend to the chiplet 13, the chiplet 13 or anchor 30 are not undercut. Since the filled trench 72 extends all of the way through the active layer 14 to the sacrificial layer 12, after the removal of the sacrificial layer 12 the chiplet 13 is suspended over the substrate 10 without any undercut in the active layer 14 of the chiplet 13 or anchor 30. In this embodiment, it is not necessarily required to remove the entire active layer 14, since the filled trench removal separates the chiplets 13 from the anchor 30.

Figure 8:
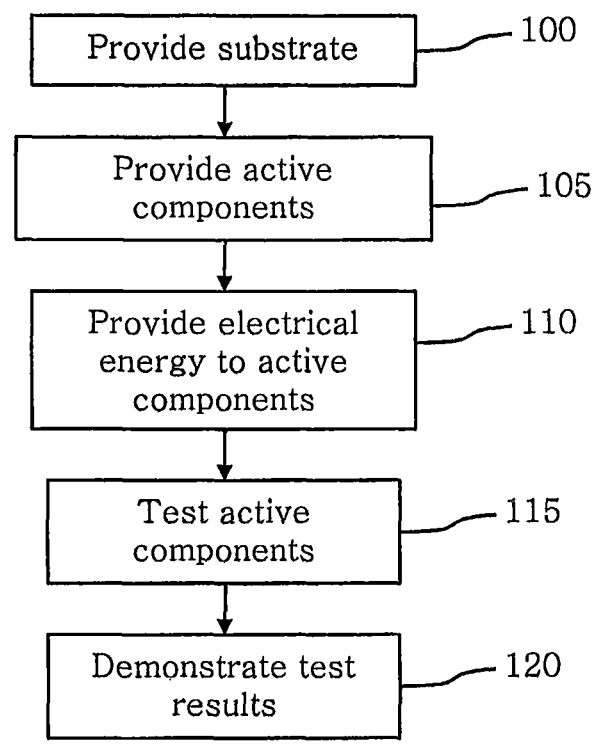
FIG. 8 is a flow chart illustrating a method of testing active components according to some embodiments of the present invention.

According to some embodiments of the present invention, the electrically conductive breakable tethers can be used in a method of testing electrical circuits formed on a wafer. Referring to FIG. 8, in a first step 100, a structure or substrate is provided, the substrate having a substrate layer and an active layer. Two or more electrically active components are formed in or on the active layer in step 105. The two or more electrically active components are distributed over the substrate, are spatially separated from each other by electrically functional anchors connected to the substrate layer, and are suspended over the substrate layer by electrically conductive breakable tethers that physically and electrically connect each electrically active component to an electrically functional anchor. Electrical energy is provided to the electrically active components through the electrically conductive breakable tethers from the electrically functional anchors, in step 110. In a further embodiment of the present invention, the electrically active components are tested with the electrical energy (step 115) while still suspended over the substrate and attached to the anchors by the tethers. The results of the test can be demonstrated (step 120) by an electrical or optical response from the electrically active components or the electrically functional anchors, for example from circuitry formed in the electrically active components or in the electrically functional anchors. An electrical response can be provided by electrical circuits, for example with a voltage; an optical response can be generated from an LED formed in the electrical circuits, for example in the anchor. Hence anchors and electrically active components can also be optically functional. The electrical energy can be provided from an external electrical device that provides electrical energy to the electrically functional anchors. The electrical energy can be supplied as current through electrical conductors or wirelessly through radiation. Thus, the active components can be tested to ensure functionality before printing or otherwise transferring the active components to a destination substrate (at which point it may be more difficult to replace a defective active component).

Referring again to the illustrations of FIGS. 5A-5F, the steps of providing the electrically active components, electrically functional anchor areas, and electrically conductive breakable tethers can further include the steps of providing a substrate having a sacrificial layer formed on the active substrate and an active layer formed on the sacrificial layer, processing the active substrate to form one or more electrically active components, one or more electrically functional anchors, and electrically conductive breakable tethers, forming a trench around each of the electrically active components, the trench extending through the active layer to the sacrificial layer, separating the active components from the electrically functional anchors except for the electrically conductive breakable tethers, and removing the sacrificial layer to suspend the electrically active components over the substrate by the electrically conductive breakable tethers.

FIGS. 10-19 A, B and C illustrate in more detail a process of forming conductive breakable tethers using polysilicon conductive elements without additional masking steps beyond those used to form active components in the chiplet or anchors. FIGS. 10A-19A are successive cross-section illustrations taken across the tether (corresponding to the cross-section line C to C' of FIG. 4). FIGS. 10B-19B are successive cross-section illustrations taken along the length of the tether and across the trench (corresponding to the cross section line D to D' of FIG. 4). FIGS. 10C-19C are successive top views of the tethers, anchors, and active components.

Figures 10A, 10B:
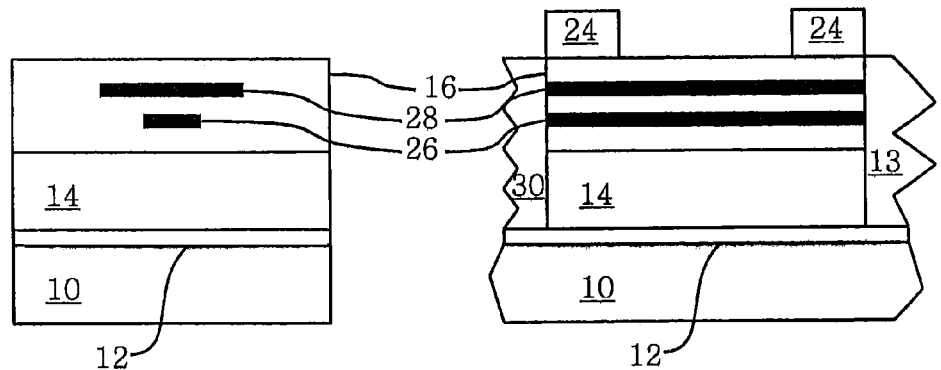
Figure 10C:
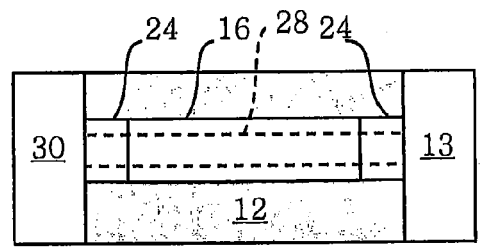
Figures 11A, 11B:
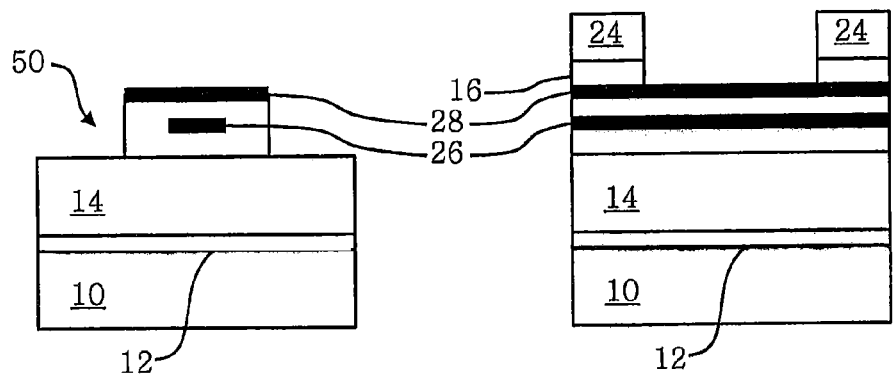
Figure 11C:
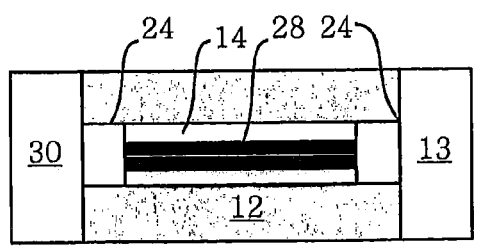
Figures 12A, 12B:
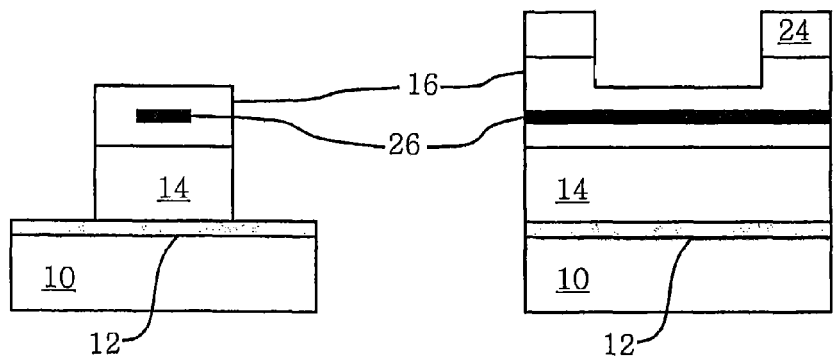
Figure 12C:
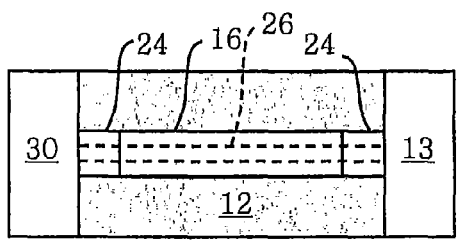

Referring first to FIGS. 10A, 10B, and 10C, a substrate 10, for example crystalline silicon has a sacrificial layer 12 (e.g. an oxide layer) formed thereon and an active layer 14 (e.g. a semiconductor layer) formed over the sacrificial layer 12. A multi-layer of insulating material such as a dielectric layer 16 (e.g. oxide, nitride, or resin) is formed over the active layer 14. The multi-layer is formed in successive stages and includes patterned polysilicon layers 26 and 28. The polysilicon layer pattern 28 extends beyond the ends of the polysilicon layer pattern 26. These layers can be formed in common with corresponding layers in the chiplets 13 or anchors 30 to which the breakable tethers are attached so that the formation of the tether elements does not require additional mask steps unique to the tether. The polysilicon conductors 26 and 28 are covered by the insulating material 16 (FIG. 10A) and extend from the chiplet 13 to the anchor 30 (FIGS. 10B, 10C). A patterned photoresist layer 24 can be formed over the top of the chiplets and anchors to protect any components thereon. Referring to FIGS. 11A, 11B and 11C, the structure can be etched, for example with a maskless oxide etch, to remove the dielectric layer 16, except where the polysilicon conductor 28 is in place and masks underlying layers. The polysilicon conductor 28 essentially provides an integrated, self-aligned mask for the polysilicon conductor 26. Referring to FIGS. 12A, 12B and 12C, the active layer 14 and then the polysilicon conductor 28 layer is removed with a maskless polysilicon etch.

Figures 13A, 13B:
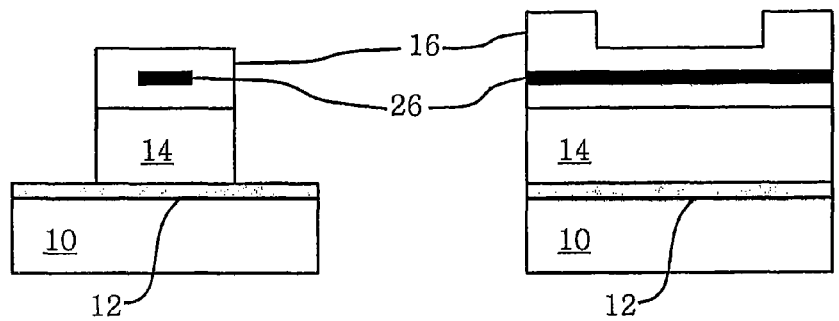
Figure 13C:
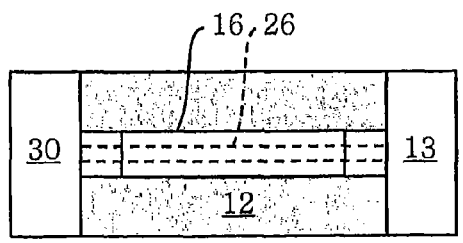

The photoresist layer 24 is then removed with a solvent strip operation as shown in FIGS. 13A, 13B, and 13C. A protective layer 61 (e.g. amorphous silicon) is blanket coated over the device (FIGS. 14A, 14B, and 14C) to protect against subsequent processing steps, especially the removal of the sacrificial layer 12. A maskless, non-conformal deposition (e.g. sputtering) is used to coat extensive planar areas with an additional protective layer 62 (e.g. a metal such as tungsten) providing only a slight covering of vertical edges, depending on the deposition conditions, shown in FIGS. 15A, 15B, and 15C, and does not cover the bottom of the trench 50. The additional protective layer 62 essentially provides a mask for the protective layer 61. The protective layer 61 can then be pattern-wise removed without a masked etching step (FIGS. 16A, 16B, and 16C) because portions of the protective layer 61 are covered with protective layer 62.

Figures 18A, 18B:
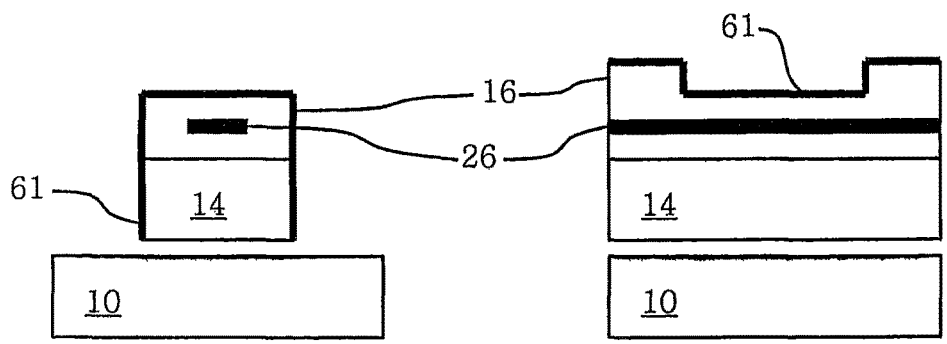
Figure 18C:
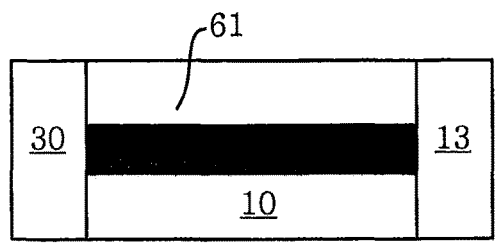

Referring to FIGS. 17A, 17B, and 17C, the sacrificial layer 12 can then be removed. This etching step can be done, for example, with a wet hydrofluoric acid etch. The protective layer 62 (e.g. polysilicon) can protect active elements in the chiplets from damage by etchants such as hydrofluoric acid. The protective layer 62 also provides a mechanically robust tether structure that is resistant to the stiction that occurs while the wet etch dries. The protective layer 62 is then removed as shown in FIGS. 18A, 18B, and 18C.

Figures 19A, 19B:
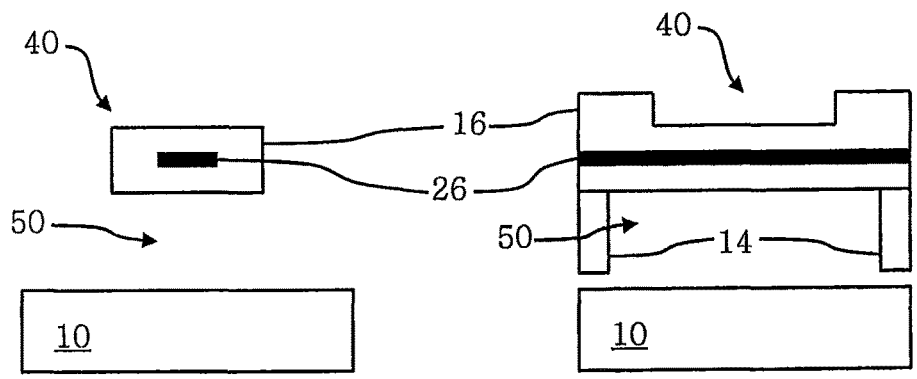
Figure 19C:
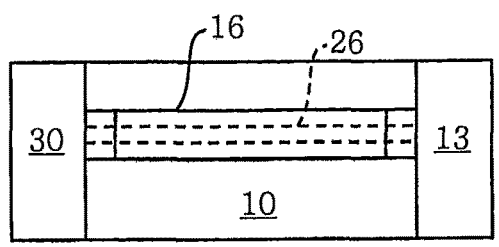

Protective layer 61 and active layer 14 are then removed without expensive masking operations (for example with a dry process using materials such as fluorine, SF6 plasma, xenon difluoride, or other plasmas or gases), as shown in FIGS. 19A, 19B, and 19C, to leave a tether with a conductive polysilicon conductor formed therein. The tether becomes mechanically weaker with the removal of the protective layers 61 and 62, but since a dry process can be employed, stiction effects are reduced. Note that the size of the tether is defined by the original polysilicon patterning step (FIGS. 10A, 10B, and 10C) and can be done in a fabrication facility at a high resolution, enabling very small breakable tethers. A variety of different etchants can be employed depending on the materials used for the protective layers 61 and 62, for example acids, hydrogen peroxide, solvents, or oxygen.

In another maskless method for forming conductive breakable tethers that include metal conductors, FIGS. 20-29 A, B, and C illustrate in more detail a process of forming conductive breakable tethers using conductive elements without additional masking steps (except for polymer resins) beyond those used to form active components in the chiplet or anchors. FIGS. 20A-29A are successive cross section illustrations taken across the tether (corresponding to the cross section line C to C' of FIG. 4). FIGS. 20B-29B are successive cross section illustrations taken along the length of the tether and across the trench (corresponding to the cross section line D to D' of FIG. 4), FIGS. 20C-29C are successive top views of the tethers, anchors, and active components.

Figures 20A, 20B:
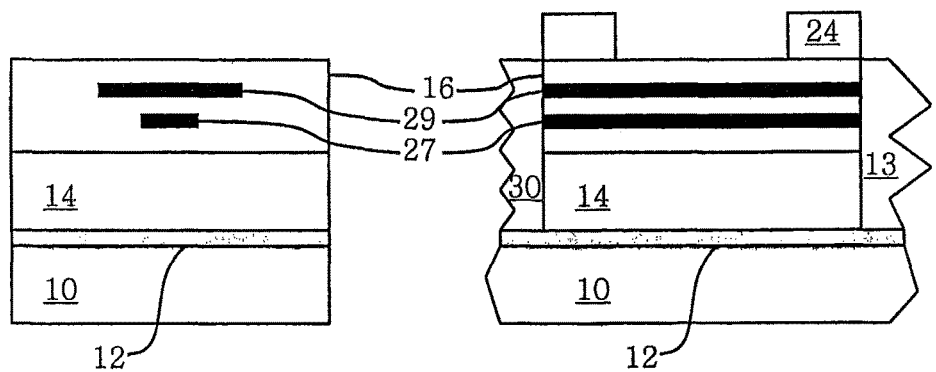
Figure 20C:
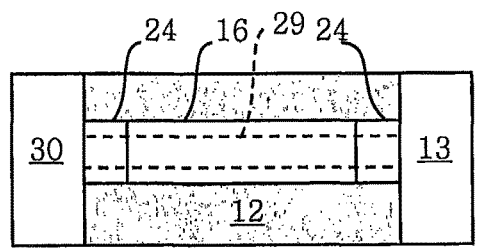

Referring first to FIGS. 20A, 20B, and 20C, a substrate 10, for example crystalline silicon has a sacrificial layer 12 (e.g. an oxide layer) formed thereupon and an active layer 14 (e.g. a semiconductor layer) formed over the sacrificial layer 12. A multi-layer of insulating material such as a dielectric layer 16 (e.g. oxide, nitride, or resin) is formed over the active layer 14. The multi-layer is formed in successive stages and includes patterned metal layers 27 and 29. The metal layer 29 width extends beyond the width of the metal layer 27. These layers can be formed in common with corresponding layers in the chiplets 13 or anchors 30 to which the breakable tethers are attached so that the formation of the breakable tether elements does not require additional semiconductor or metal mask steps unique to the tether. The metal conductors 27 and 29 are covered in the insulating dielectric material 16 (FIG. 20A) and extend from the chiplet 13 to the anchor 30 (FIGS. 20B, 20C). A patterned photoresist layer can be formed over the top of the chiplets and anchors to protect any components thereon.

Figures 21A, 21B:
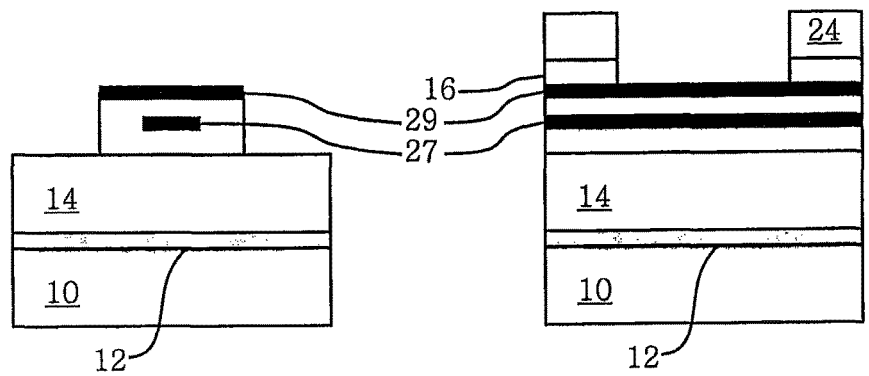
Figure 21C:
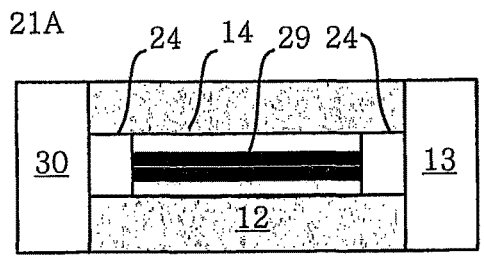
Figures 22A, 22B:
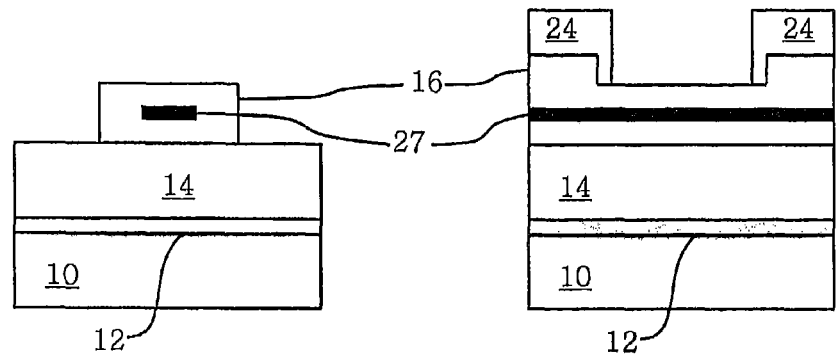
Figure 22C:
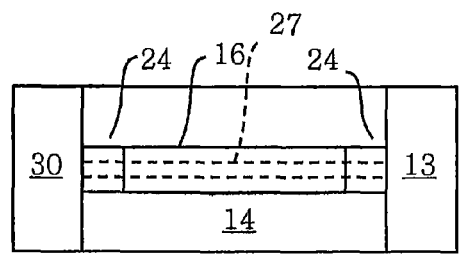

Referring to FIGS. 21A, 21B, and 21C, the structure can be etched, for example, with a maskless oxide etch, to remove the dielectric layer, except where the metal conductor 29 is in place and masks underlying layers. The metal conductor 29 essentially provides an integrated, self-aligned mask for the metal conductor 27. Referring to FIGS. 22A, 22B, and 22C, an additional photo-resin layer 24 is deposited and patterned, leaving the active layer 14 exposed.

Figures 23A, 23B:
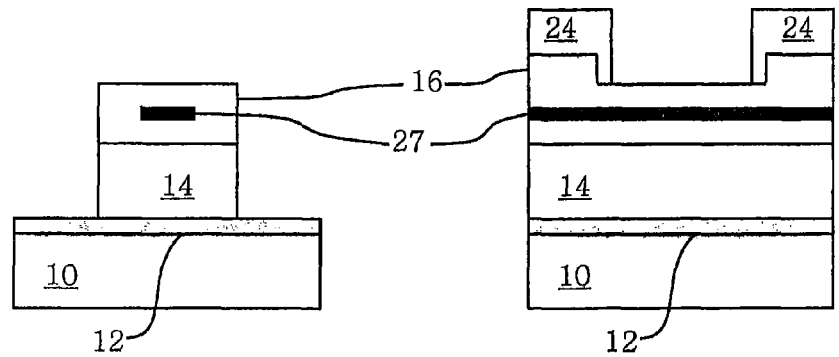
Figure 23C:
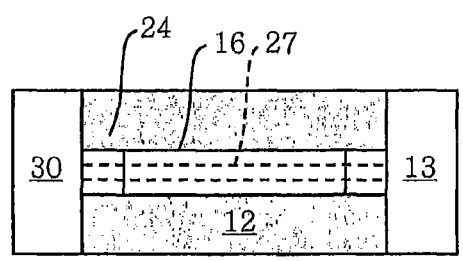
Figures 26A, 26B:
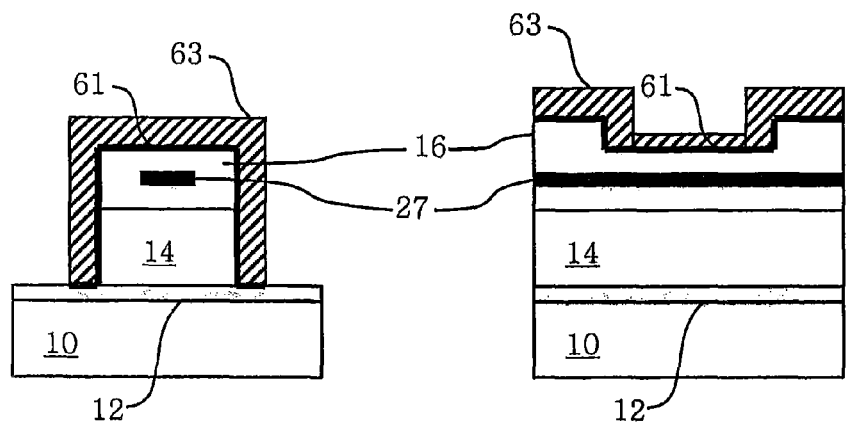
Figure 26C:
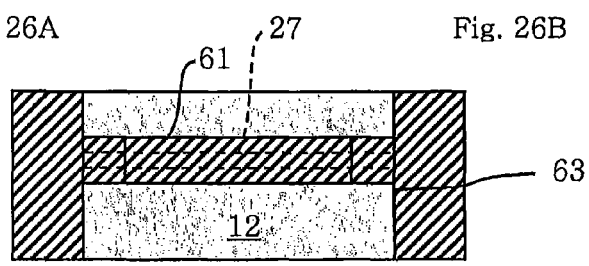

Exposed portions of active layer 14 are etched away as shown in FIGS. 23A, 23B, and 23C, to expose the sacrificial layer 12. A protective layer 61 (e.g. amorphous silicon) is blanket coated over the device (FIGS. 24A, 24B, and 24C) to protect against subsequent processing steps, especially the sacrificial layer removal. A protective coating 63 of resin is deposited over the device and then patterned to expose portions of the protective layer 61 in FIGS. 25A, 25B, and 25C. The additional protective layer 63 essentially provides a mask for the protective layer 61. The protective layer 61 can then be pattern-wise removed without a masked etching step (FIGS. 26A, 26B, and 26C) to expose the sacrificial layer 12.

Figures 27A, 27B:
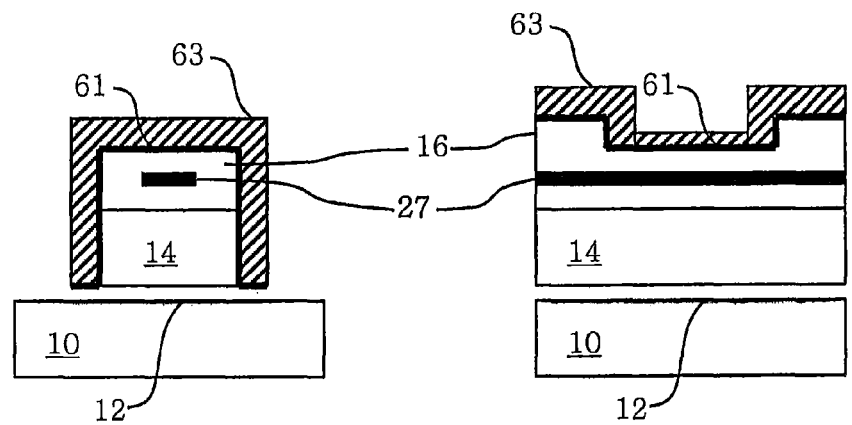
Figure 27C:
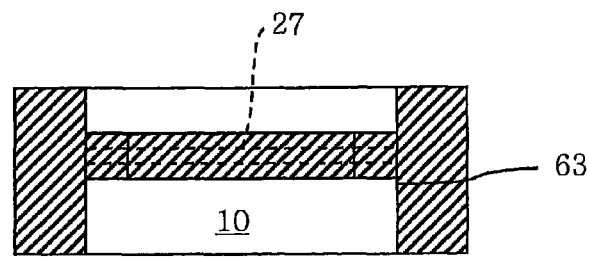
Figures 28A, 28B:
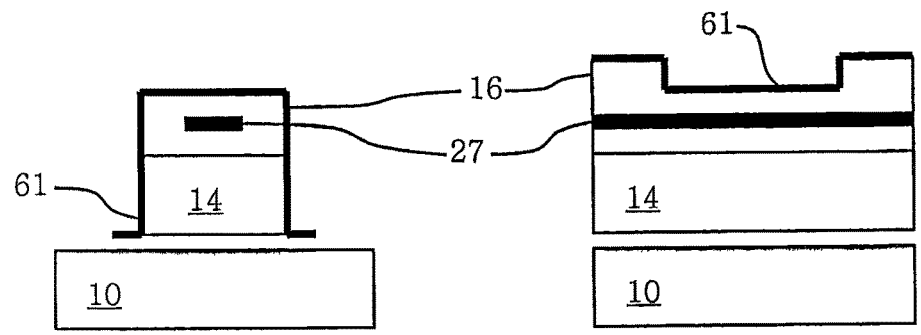
Figure 28C:
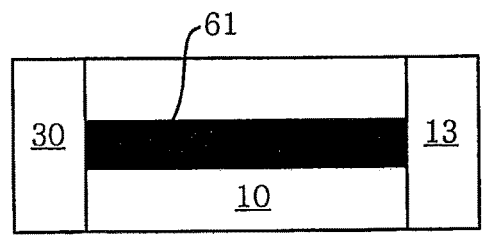
Figures 29A, 29B:
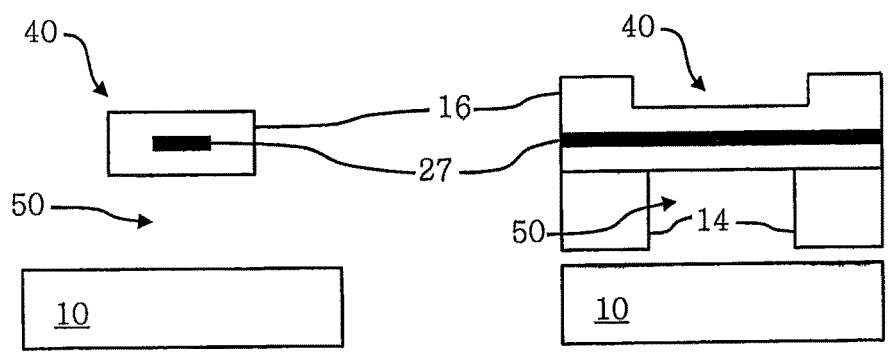
Figure 29C:
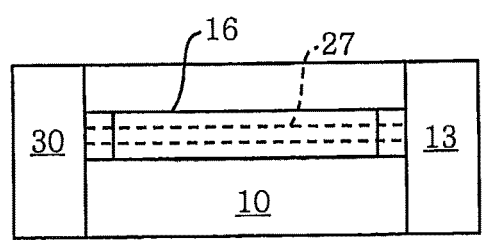

Referring to FIGS. 27A, 27B, and 27C, the sacrificial layer 12 can then be removed. This etching step can be done, for example, with a wet hydrofluoric acid etch. The protective layer 61 (e.g. polysilicon) as well as the protective layer 63 can protect active elements in the chiplets from damage by etchants such as hydrofluoric acid. The protective layer 63 is then removed (for example by a solvent) as shown in FIGS. 28A, 28B, and 28C, and then the protective layer 61 is removed (FIGS. 29A, 29B, and 29C) to leave a tether with a conductive metal conductor formed without expensive masking operations. A variety of different etchants can be employed depending on the materials used for the protective layers 61 and 63, for example acids, hydrogen peroxide, solvents, or oxygen.

According to embodiments of the present invention, patterning the conductive layers in the electrically conductive breakable tethers and one or more of the electrically active components or one or more electrically functional anchors can be done in a common processing step. Hence, forming electrically conductive breakable tethers can be done using the same masks that are used to form at least some of the one or more electrically active components or at least some of the one or more electrically functional anchors.

According to various embodiments of the present invention, a variety of different materials can be used to form the breakable tethers. Depending on the material, the characteristics of the break in the tether when stress is applied to the chiplet can also vary. For example, crystalline silicon tends to crack when stressed, while more ductile materials, such as metals, tend to deform. It has been shown that particulate contamination can be related to the breaking patterns of the tethers. Crystalline silicon tends to create small contaminating particles when cracked. These particles tend to adhere to the chiplets and prevent proper printing on to a destination substrate. In contrast, ductile metals tend to create fewer particles when stressed and broken. Hence, in one embodiment of the present invention, ductile materials are employed to form at least a portion of the breakable tethers. Experience has shown that polysilicon materials also tend to create fewer particles when stressed and broken. Hence, in another embodiment of the present invention, polysilicon materials are employed to form at least a portion of the breakable tethers.

Figure 30A:
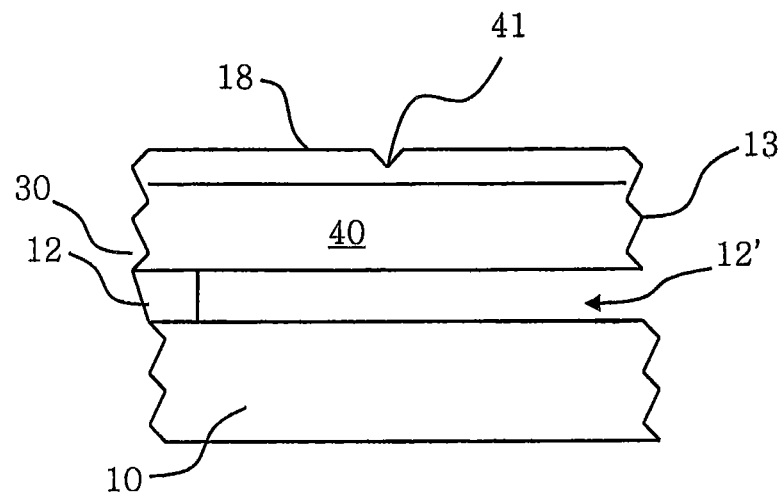
FIGS. 30A and 30B are a cross section and top view, respectively, of a tether having a stress-concentrating feature according to some embodiments of the present invention.
Figure 30B:
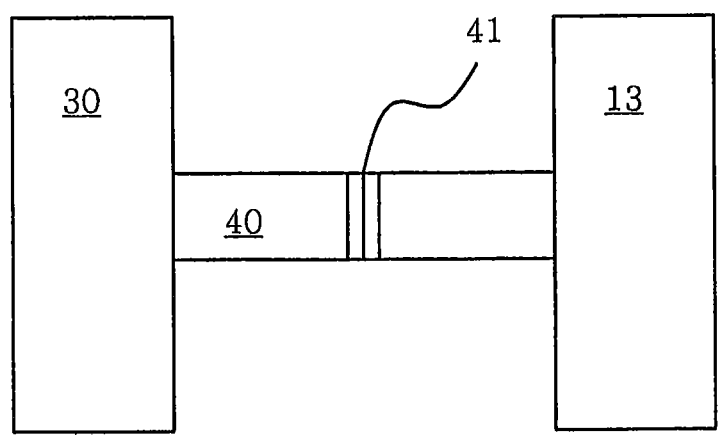
Figure 31:
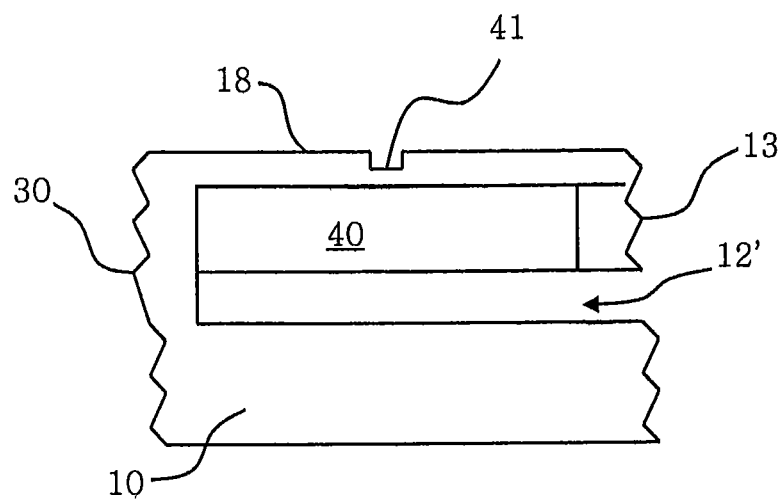
FIG. 31 is a cross section of a stress-concentrating feature.
Figure 32:
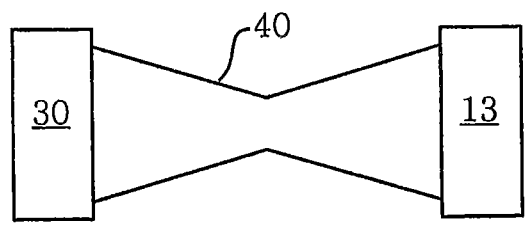
FIGS. 32-39 are top view illustrations of a variety of stress-concentrating features.
Figure 33:
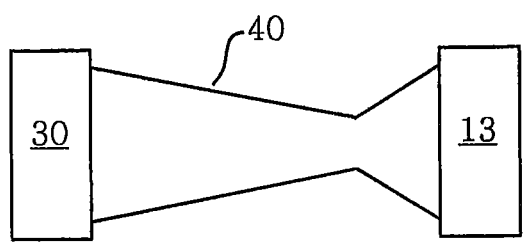
Figure 34:
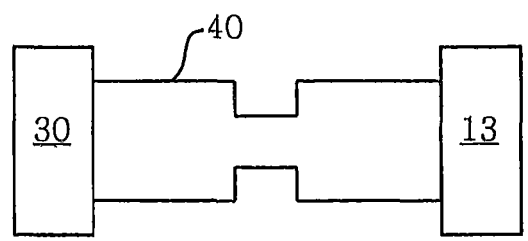
Figure 35:
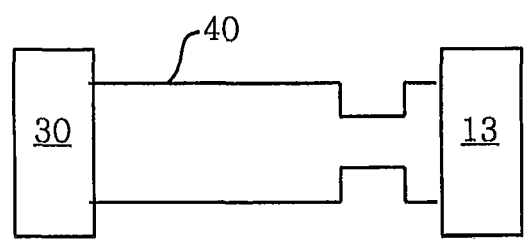
Figure 36:
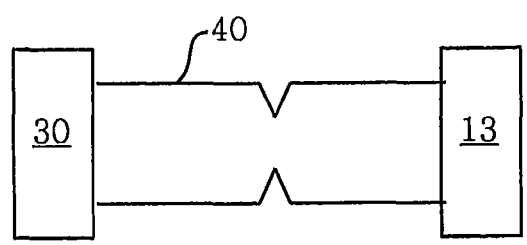
Figure 37:
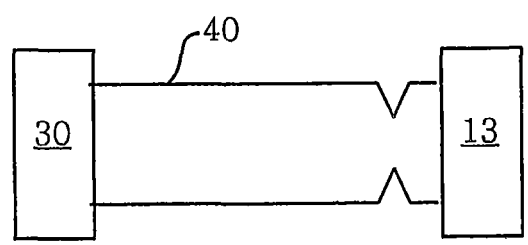
Figure 38:
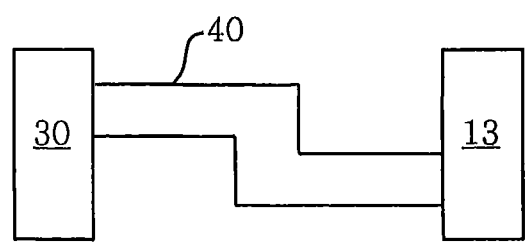
Figure 39:
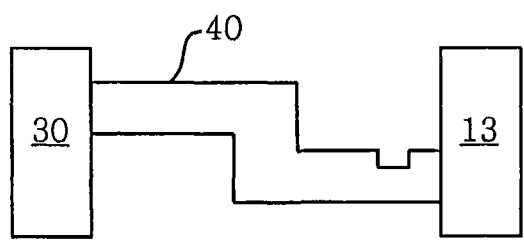

Stress-concentrating structures in a breakable tether can reduce particulate contamination when the tethers are broken. Such structures can also reduce the force necessary to break the tethers and can reduce the fracturing variability, for example the fracture location or process. Referring to FIG. 30A in a cross section taken along line D-D' of FIG. 4 and FIG. 30B in a top view, a stress-concentrating feature 41 is located in the metal layer 18 of the tether 40. The tether 40 connects the anchor 30 and the chiplet 13 and is suspended over the substrate 10 with the removed sacrificial layer 12' between the tether 40 and the substrate 10. Stress-concentrating features form a location in a tether that is preferentially fractured when stress is applied to a chiplet. FIGS. 31-39 illustrate a variety of stress-concentrating features. Stress-concentrating features 41 can be formed in different locations, in different material layers, or in more than one material layer, according to different embodiments of the present invention. One or more stress-concentrating features can be employed in one tether. Stress-concentrating features can be formed in the plane of the tether (e.g. as shown in FIG. 30A) or out-of-plane (e.g. as illustrated in FIGS. 32-39). Stress-concentrating features can be formed using conventional photolithographic means and can include, for example, grooves or areas of decreased thickness formed across the width of the tether. Stress-concentrating features can be located in different locations in the tether, for example in the center or either end of the tether.

Embodiments of the present invention provide several manufacturing advantages. For example, the tethers that secure the chiplets to the anchor areas can be small and easily fractured so that the chiplets can be removed by stamps relying on van der Waal's forces. At the same time, embodiments of the present invention provide electrical conductors through the tethers to enable active component testing prior to removal from the substrate. Over a relatively large substrate, it can be difficult and expensive to maintain a close tolerance necessary for constructing electrical conductors in small, breakable tethers, in particular by requiring numerous masking steps. By employing the structures and methods of the present invention, such constraints and challenges can be ameliorated.

The electrically conductive breakable tethers can be electrically connected to both the electrically active components and the electrically functional anchors by employing metal conductors that are in physical contact with the electrically active components and the electrically functional anchors. The metal conductors can be formed in multiple layers with the electrically active components and the electrically functional anchors and can be electrically connected to multiple layers of conductors within a tether.

The present invention is described herein with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "in contact with" or "connected to" or "coupled to" another element, it can be directly contacting or connected to or coupled to the other element or intervening elements may be present. In contrast, when an element is referred to as being "in direct contact with" or "directly connected to" or "directly coupled to" another element, there are no intervening elements present.

It will also be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Furthermore, relative terms, such as "under" or "lower" or "bottom," and "over" or "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The terminology used in the description of the invention herein is for the purpose of describing particular embodiments only and is not intended to be limiting of the invention. As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. In other words, the regions illustrated in the figures are schematic in nature and their shapes are not intended to illustrate the actual shape of a region of a device and are not intended to limit the scope of the invention.

Unless otherwise defined, all terms used in disclosing embodiments of the invention, including technical and scientific terms, have the same meaning as commonly understood by one of ordinary skill in the art to which this invention belongs, and are not necessarily limited to the specific definitions known at the time of the present invention being described. Accordingly, these terms can include equivalent terms that are created after such time. It will be further understood that terms, such as those defined in commonly used dictionaries, should be interpreted as having a meaning that is consistent with their meaning in the present specification and in the context of the relevant art and will not be interpreted in an idealized or overly formal sense unless expressly so defined herein. All publications, patent applications, patents, and other references mentioned herein are incorporated by reference in their entireties.

As used herein the expressions "semiconductor component," "semiconductor element," and "semiconductor structure" are used synonymously and broadly refer to a semiconductor material, structure, layer, device, and/or component of a device. Semiconductor elements include high quality single crystalline and polycrystalline semiconductors, semiconductor materials fabricated via high temperature processing, doped semiconductor materials, organic and inorganic semiconductors and composite semiconductor materials and structures having one or more additional semiconductor components and/or non-semiconductor components, such as dielectric layers or materials and/or conducting layers or materials. Semiconductor elements include semiconductor devices and device components including, but not limited to, transistors, photovoltaics including solar cells, diodes, light emitting diodes, lasers, p-n junctions, photodiodes, integrated circuits, and sensors. In addition, semiconductor elements refer to a part or portion that forms an end functional semiconductor.

"Printing" refers to a process of transferring a feature, such as a semiconductor component or element, from a first surface to a second surface. In some embodiments, the first surface is a donor surface and the second surface a receiving surface, and the transfer is mediated by an intermediate surface, such as an elastomeric stamp, which is capable of releasing the elements to a receiving surface on a target substrate, thereby transferring the semiconductor element. In some embodiments, the printing is dry transfer printing of printable semiconductors, wherein the adhesive force between a solid object and the stamp surface is rate-sensitive. Transfer printing methods are further described, for example, in U.S. Pat. No. 7,622,367 entitled "Methods and Devices for Fabricating and Assembling Printable Semiconductor Elements," the disclosure of which is incorporated by reference herein.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

The invention has been described in detail with particular reference to certain preferred embodiments thereof, but it will be understood that variations and modifications can be effected within the spirit and scope of the invention.

What is claimed is:

1. A structure, comprising:
   a substrate; and
   a plurality of printable electronic components, each of the printable electronic components attached to the substrate by one or more breakable tethers that physically secure the printable electronic component to the substrate, wherein at least one of the one or more breakable tethers has a first end and a second end opposite the first end and comprises a stress-concentrating feature between the first end and the second end that causes the breakable tether to preferentially fracture at the stress-concentrating feature in response to pressure,
   wherein, for each breakable tether of the at least one of the one or more breakable tethers, the stress-concentrating feature of the breakable tether has a feature cross section of smaller area than a tether cross section of the breakable tether.

2. The structure of claim 1, wherein the stress-concentrating features comprise grooves.

3. The structure of claim 1, wherein the stress-concentrating features comprise portions of the respective tethers having a reduced thickness relative to other portions thereof.

4. The structure of claim 1, wherein the stress-concentrating features comprise a notch in each of the one or more breakable tethers.

5. The structure of claim 4, wherein the stress-concentrating features comprise two notches in each of the one or more breakable tethers.

6. The structure of claim 1, wherein the stress-concentrating features comprise one or more stress-concentrating features at a center of each of the one or more breakable tethers.

7. The structure of claim 1, wherein the stress-concentrating features comprise one or more off-center stress-concentrating features.

8. The structure of claim 1, wherein the one or more breakable tethers are z-shape breakable tethers.

9. The structure of claim 1, wherein the stress concentrating features of the one or more breakable tethers are configured to be preferentially fractured responsive to pressure applied by a stamp to transfer the at least one electronic component to a target substrate.

10. The structure of claim 1, further comprising an anchor physically secured to a surface of the substrate, wherein each of the printable electronic components is secured to the substrate via the anchor and a respective tether.

11. The structure of claim 10, wherein the anchor comprises one or more electrical elements to conduct an electrical test signal.

12. The structure of claim 11, wherein the one or more breakable tethers are electrically conductive breakable tethers.

13. The structure of claim 12, wherein the electrically conductive breakable tethers electrically connect the plurality of printable electronic components to the one or more electrical elements of the anchor.

14. The structure of claim 13, wherein the one or more electrical elements of the anchor area are electrically connected to the printable electronic components by the electrically conductive breakable tethers such that one or more test signals can be sent from the one or more electrical elements of the anchor area to the printable electronic components.

15. The structure of claim 14, wherein at least one of the printable electronic components is defective.

16. The structure of claim 1, wherein the printable electronic components are light-emitting diodes.

17. The structure of claim 16, wherein the light-emitting diodes are inorganic light-emitting diodes.

18. The structure of claim 1, wherein each of the printable electronic components comprises an active layer.

19. The structure of claim 18, wherein the active layer is amorphous, polycrystalline, microcrystalline, or crystalline.

20. The structure of claim 18, wherein the active layer comprises silicon, gallium arsenide (GaAs), and/or a III-V compound semiconductor.

21. The structure of claim 1, wherein, for each breakable tether of the at least one of the one or more breakable tethers, at least a portion of the breakable tether has a substantially constant tether cross section and the stress-concentrating feature of the breakable tether has a feature cross section of smaller area than the substantially constant tether cross section.

* * * * *